United States Patent
Duggal et al.

(10) Patent No.: US 10,514,401 B2
(45) Date of Patent: Dec. 24, 2019

(54) ON-CHIP FREQUENCY MONITORING

(71) Applicant: QUALCOMM Incorporated, San Diego, CA (US)

(72) Inventors: Bipin Duggal, Irvine, CA (US); Rahul Gulati, San Diego, CA (US); Sina Dena, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 100 days.

(21) Appl. No.: 15/667,116

(22) Filed: Aug. 2, 2017

(65) Prior Publication Data

US 2019/0041440 A1 Feb. 7, 2019

(51) Int. Cl.
| | |
|---|---|
| *G01R 23/02* | (2006.01) |
| *G01R 31/317* | (2006.01) |
| *G01R 23/10* | (2006.01) |
| *G01R 23/15* | (2006.01) |
| *G01R 35/00* | (2006.01) |
| G01R 23/14 | (2006.01) |
| G01R 23/00 | (2006.01) |

(52) U.S. Cl.
CPC ............. *G01R 23/02* (2013.01); *G01R 23/10* (2013.01); *G01R 23/15* (2013.01); *G01R 31/31727* (2013.01); *G01R 35/005* (2013.01); G01R 23/005 (2013.01); G01R 23/14 (2013.01)

(58) Field of Classification Search
CPC .. G01R 23/02; G01R 31/31727; G01R 23/10; G01R 23/15; G01R 23/005; G01R 23/14
USPC ..................................... 324/72, 76.11–76.83
See application file for complete search history.

(56) References Cited

U.S. PATENT DOCUMENTS

| | | |
|---|---|---|
| 6,008,671 A | 12/1999 | Kang et al. |
| 6,008,672 A | 12/1999 | Suto et al. |
| 6,304,517 B1 | 10/2001 | Ledfelt et al. |
| 6,665,367 B1 | 12/2003 | Blair et al. |
| 7,242,223 B1 | 7/2007 | Alon |
| 8,937,496 B1 | 1/2015 | Ahmad et al. |
| 9,234,938 B2 | 1/2016 | Khullar et al. |
| 9,500,706 B2 | 11/2016 | Sanghani et al. |
| 2011/0158031 A1* | 6/2011 | Ware .................... H03L 7/00 365/233.11 |
| 2012/0112803 A1 | 5/2012 | Goh et al. |
| 2013/0307509 A1* | 11/2013 | Henzler .............. H03K 7/08 323/283 |
| 2014/0070849 A1 | 3/2014 | Feist et al. |

(Continued)

OTHER PUBLICATIONS

International Search Report and Written Opinion—PCT/US2018/041477—ISA/EPO—dated Oct. 18, 2018.

*Primary Examiner* — Raul J Rios Russo
(74) *Attorney, Agent, or Firm* — Loza & Loza, LLP/Qualcomm

(57) ABSTRACT

In certain aspects of the disclosure, a frequency monitor includes a counter configured to receive a monitored clock signal, to count a number of periods of the monitored clock signal over a predetermined time duration, and to output a count value corresponding to the number of periods of the monitored clock signal. The frequency monitor also includes a comparator configured to receive the count value from the counter, to receive an expected count value, to compare the count value from the counter with the expected count value, and to output a pass status signal or a fail status signal based on the comparison.

21 Claims, 18 Drawing Sheets

(56) References Cited

U.S. PATENT DOCUMENTS

| | | | |
|---|---|---|---|
| 2014/0367551 A1* | 12/2014 | Hwang | H03K 21/026 |
| | | | 250/208.1 |
| 2015/0358023 A1* | 12/2015 | Hsieh | H03K 21/40 |
| | | | 377/29 |
| 2016/0065215 A1* | 3/2016 | Shin | H03K 19/0016 |
| | | | 327/45 |
| 2016/0359476 A1 | 12/2016 | Yu et al. | |
| 2019/0004562 A1* | 1/2019 | Gupta | G06F 1/08 |

* cited by examiner

ON-CHIP FREQUENCY MONITORING

BACKGROUND

Field

Aspects of the present disclosure relate generally to frequency monitoring, and more particularly, to on-chip frequency monitoring.

Background

A block (e.g., processor) on a chip receives a clock signal (e.g., from an on-chip clock source) to time operations of the block. In order for the block to function properly, the frequency of the clock signal needs to lie within an acceptable frequency range.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a frequency monitor. The frequency monitor includes a counter configured to receive a monitored clock signal, to count a number of periods of the monitored clock signal over a predetermined time duration, and to output a count value corresponding to the number of periods of the monitored clock signal. The frequency monitor also includes a comparator configured to receive the count value from the counter, to receive an expected count value, to compare the count value from the counter with the expected count value, and to output a pass status signal or a fail status signal based on the comparison.

A second aspect relates to a method for frequency monitoring. The method includes receiving a monitored clock signal, counting a number of periods of the monitored clock signal over a predetermined time duration, and generating a count value corresponding to the number of periods of the monitored clock signal counted over the predetermined time duration. The method also includes comparing the generated count value with an expected count value, and generating a pass status signal or a fail status signal based on the comparison.

A third aspect relates to a frequency monitoring system. The system includes multiple frequency monitors coupled in a daisy chain, wherein each of the multiple frequency monitors is configured to monitor a frequency of a respective one of multiple clock signals. The system also includes a monitor processor coupled to an enable input of a first one of the multiple frequency monitors in the daisy chain, and a status output of a last one of the multiple frequency monitors in the daisy chain, and wherein the monitor processor is configured to output an enable signal to the first one of the multiple frequency monitors, to determine that all of the multiple clock signals meet a specification if the monitor processor receives a pass status signal from the last one of the frequency monitors in response to the enable signal, and to determine that one or more of the multiple clock signals fail to meet the specification if the monitor processor does not receive the pass status signal from the last one of the frequency monitors in response to the enable signal.

A fourth aspect relates to a frequency monitoring system. The system includes a multiplexer having multiple inputs and an output, wherein each of the multiple inputs is coupled to a respective one of multiple clock signals. The system also includes a select controller configured to instruct the multiplexer to sequentially couple each clock signal in a subset of the multiple clock signals to the output of the multiplexer. The system further includes a frequency monitor coupled to the output of the multiplexer, wherein the frequency monitor is configured to sequentially receive each clock signal in the subset of the multiple clock signals, and wherein, for each clock signal in the subset of the multiple clock signals, the frequency monitor is configured to determine whether the clock signal is within a respective frequency range, and to output a status signal based on the determination.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

Figure 1:
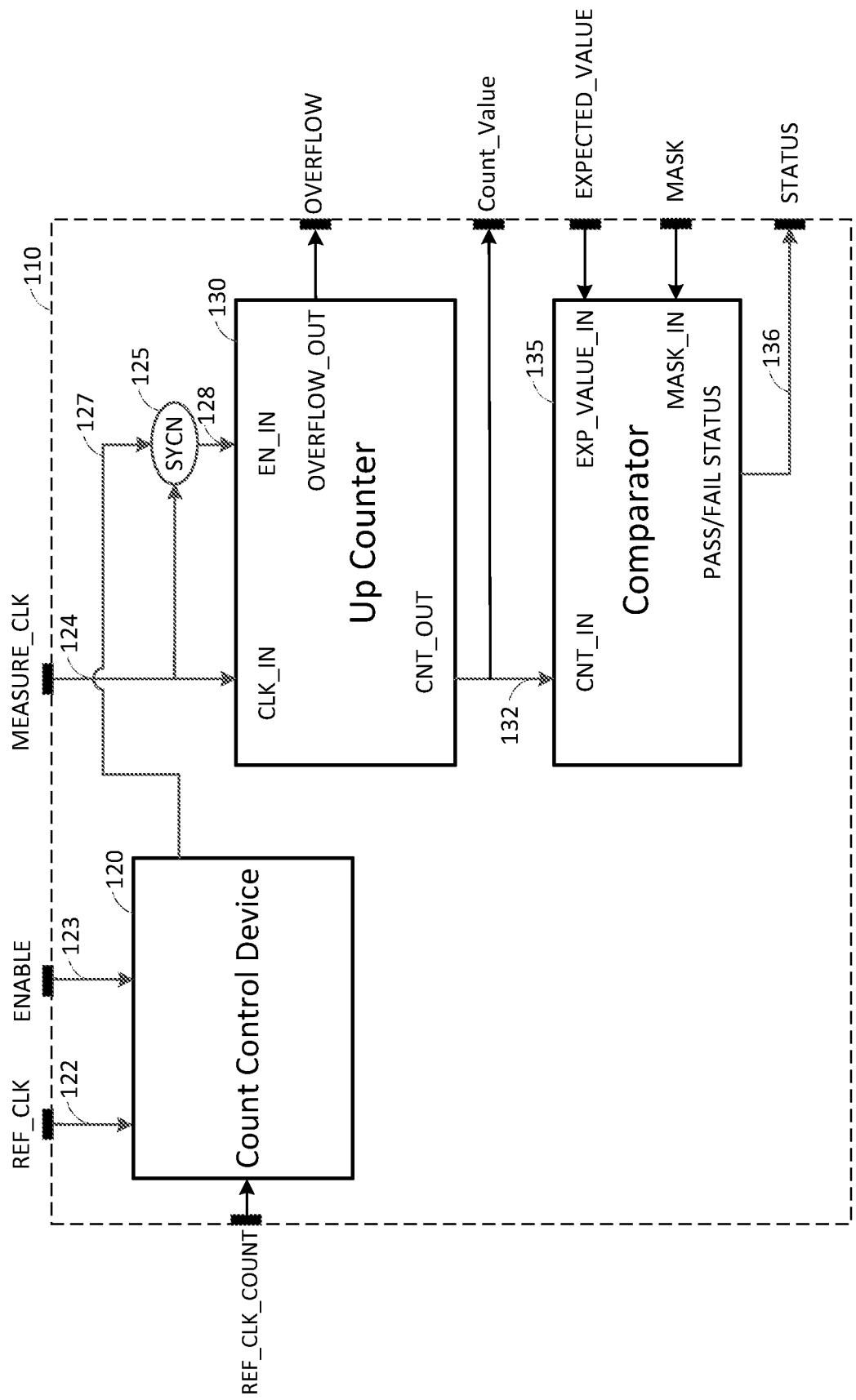
FIG. 1 shows an example of an on-chip frequency monitor according to certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

For a safety critical system (e.g., an advanced driver assistance system (ADAS)), it is important for critical blocks of the system to function properly. The critical blocks may receive clock signals from one or more clock sources (e.g., via a clock tree) to time operations of the blocks. In order for each block to function properly, the frequency of the respective clock signal needs to lie within an acceptable frequency range defined by a specification (i.e., the clock frequency needs to meet the specification).

In this regard, methods have been developed to measure the frequency of a clock signal used on a chip to determine whether the clock frequency meets a specification. In one approach, the chip includes a special pad that allows the clock signal to be routed to external (off-chip) test equipment for measuring the frequency of the clock signal. The special pad is typically large, taking up a large area of the chip. The pad also increases test time by requiring that the test equipment make physically contact with the pad in order to measure the clock frequency.

In addition, the pad typically has a limited frequency range (e.g., 500 MHz). A problem with this is that the frequency of the clock signal being measured can be in the GHz range. The limited frequency range of the pad requires that the frequency of the clock signal be reduced on-chip to a lower frequency (e.g., using an on-chip frequency divider) before the clock signal is routed to the pad for measurement by the external test equipment.

Another problem is that the current approach does not measure the frequency of a clock signal in real time when the respective block is operating in the functional mode. As a result, the current approach does not guarantee that the clock frequency will meet the specification in the functional mode.

Embodiments of the present disclosure provide on-chip frequency monitors capable of monitoring the frequency of a clock signal on a chip in real time. In some embodiments, a frequency monitor receives a clock signal, determines whether the frequency of the clock signal meets a specification, and outputs a pass/fail status signal indicating whether the frequency of the clock signal meets the specification. Because the frequency monitor is on-chip, the frequency monitor eliminates the need for the special pad discussed above for routing the clock signal to external test equipment.

FIG. 1 shows an example of an on-chip frequency monitor 110 according to certain aspects of the present disclosure. The on-chip frequency monitor 110 includes an up counter 130, a count control device 120, a synchronizer 125, and a comparator 135.

The up counter 130 receives the clock signal being monitored at a clock input (labeled "CLK_IN"). In the description below, the clock signal being monitored is referred to as the monitored clock signal 124. The monitored clock signal 124 may be the clock signal of a block (e.g., a CPU) located on the same chip as the on-chip frequency monitor 110.

The synchronizer 125 receives a count enable signal 127 from the count control device 120, and synchronizes the count enable signal 127 with the monitored clock signal 124 to generate a synchronized count enable signal 128. For example, the synchronizer 125 may align an edge of the count enable signal 127 with an edge of the monitored clock signal 124 to generate the synchronized count enable signal 128, as discussed further below. The up counter 130 receives the synchronized count enable signal 128 at an enable input (labeled "EN_IN").

In operation, the up counter 130 counts periods (cycles) of the monitored clock signal 124 when the synchronized count enable signal 128 is high, and outputs the resulting count value (labeled "CNT_VALUE") at a count output (labeled "CNT_OUT") to the comparator 135, as discussed further below. The up counter 130 stops counting when the synchronized count enable signal 128 is low.

The count control device 120 receives an input enable signal (labeled "ENABLE") and a reference clock signal (labeled "REF_CLK"). The input enable signal 123 may come from a monitor processor, as discussed further below. The reference clock signal 122 has a well-defined frequency and may come from a crystal oscillator or another clock source with a well-defined frequency. As discussed further below, the count control device 120 uses the reference clock signal 122 to define a time duration (time window) over which the up counter 130 counts a number of periods (cycles) of the monitored clock signal 124.

In operation, the count control device 120 enables the up counter 130 when the input enable signal 123 is asserted (i.e., transitions from low to high). The count control device 120 enables the up counter 130 by asserting the count enable signal 127 (i.e., transitioning the count enable signal 127 from low to high). This causes the up counter 130 to start counting.

The count control device 120 allows the up count 130 to count for the defined time duration (time window). At the end of the time duration (time window), the count control device 120 stops the up counter 130 by de-asserting the count enable signal 127 (i.e., transitioning the count enable signal 127 from high to low). Thus, the count value 132 of the up counter 130 at the end of the time duration (time window) indicates the number of periods (cycles) of the monitored clock signal 124 that the up counter 130 counted over the time duration (time window).

The count control device 120 determines the time duration (time window) based on a predetermined number of periods (cycles) of the reference clock signal 122. For example, if the predetermined number of periods (cycles) is R, then the time duration (time window) is approximately given by R*p, wherein p is one period of the reference clock signal 122 (i.e., one over the frequency of the reference clock signal 122). Since the frequency of the reference clock signal 122 is well defined, the time duration is also well defined. In certain aspects, the number of periods R of the reference clock signal 122 (and hence the time duration) is programmable. In this regard, FIG. 1 shows an example in which the count control device 120 receives a count control signal (labeled "REF_CLK_COUNT") specifying the number of periods R of the reference clock signal. In this example, the count control device 120 enables the up counter 130 for a time duration of approximately R*p, where R is specified by the count control signal.

The comparator 135 receives the count value 132 from the counter 130 at a count input (labeled "CNT_IN"), where the count value 132 indicates the number of periods (cycles) of the monitored clock signal 124 that the up counter 130 counted over the time duration. The comparator 135 also receives an expected count value (labeled "EXPECTED_VALUE) at an expected count value input (labeled "EXP_VALUE_IN"). The expected count value represents the count value that should be output from the counter 130 if the frequency of the monitored clock signal 124 is approximately equal to an expected frequency (i.e., a frequency meeting a specification). The expected count value may be given by approximately $f_d*T$, where $f_d$ is the expected frequency and T is the time duration (time window) over which the up counter 130 counts the number of periods (cycles) of the monitored clock signal 124.

The comparator 135 then compares the count value 132 from the up counter 130 with the expected count value, and outputs a status signal 136 based on the comparison indicating whether the frequency of the monitored clock signal 124 meets the specification. For example, if the count value 132 from the up counter 130 matches the expected count value, then the status signal 136 indicates a pass (i.e., the specification is met). If the count value 132 from the up counter 130 does not match the expected count value, then the status signal 136 indicates a fail (i.e., the specification is not met).

In some embodiments, when the comparator 135 compares the count value 132 from the up counter 130 with the expected count value, the comparator 135 masks out (ignores) the N least significant bits (LSBs) of the count value 132 and the N LSBs of the expected count value, where N is an integer. This causes the comparator 135 to output a status signal 136 indicating a pass when the M-N most significant bits (MSBs) of the count value 132 match the M-N MSBs of the expected count value, regardless of whether the N LSBs of the count value 132 match the N LSBs of the expected count value, where M is the number of bits of each value.

As a result, the comparator 135 outputs a pass status signal when the count value 132 from the up counter 130 is within a certain range of the expected count value. The range is a function of the number (i.e., N) of LSBs that are masked out (ignored). For example, if N equals four, then the range is approximately equal to +/−16 counts. In general, the larger the number of LSBs that are masked out, the larger the range, and the smaller the number of LSBs that are masked out, the smaller the range. Thus, in these embodiments, the count value 132 from the up counter 135 does not have to be exactly equal to the expected count value for the comparator 135 to output a pass status signal.

In certain aspects, the number of LSBs that the comparator 135 masks out is programmable. In this regard, FIG. 1 shows an example in which the comparator 135 receives a mask control signal (labeled "MASK") at a mask input (labeled "MASK_IN"), where the mask control signal specifies the number (i.e., N) of LSBs that are to be masked out (ignored) by the comparator 135. The mask control signal allows a monitor processor to program the range within which the comparator outputs a pass status signal. For example, the monitor processor may increase the range (e.g., if a larger frequency variation can be tolerated) by increasing the number of LSBs specified by the mask control signal. The monitor processor may decrease the range (e.g., if less frequency variation can be tolerated) by decreasing the number of LSBs specified by the mask control signal. Thus, in this example, the frequency monitor 110 outputs a pass status signal if the frequency of the monitored clock signal 124 lies within a certain frequency range, and outputs a fail status signal if the frequency of the monitored clock signal 124 lies outside the frequency range. The frequency range is a function of the number of LSBs that are masked out and the expected count value.

In the example shown in FIG. 1, the up counter 130 outputs an overflow signal (labeled "OVERFLOW") at an overflow output (labeled "OVERFLOW_OUT"), where the overflow signal indicates whether the up counter 130 has overflowed (i.e., reached the count limit of the up counter 130). The up counter 130 also outputs the count value 132 to one or more devices (not shown) located outside the frequency monitor 110. In this example, the count value 132 provides the one or more devices with a digital measurement of the frequency of the monitored clock signal 124. This is because the count value 132 is approximately proportional to the frequency of the monitored clock signal 124.

Therefore, the on-chip frequency monitor 110 monitors the frequency of the monitored clock signal 124, and outputs a status signal 136 indicating whether the frequency of the monitored clock signal 124 meets a specification. In one example, a status signal 136 of one means pass, and a status signal 136 of zero means fail. The monitored clock signal 124 may be the clock signal of a critical block (e.g., CPU) located on the same chip as the frequency monitor 110. An example of this is discussed below with reference to FIG. 5.

Figure 2:
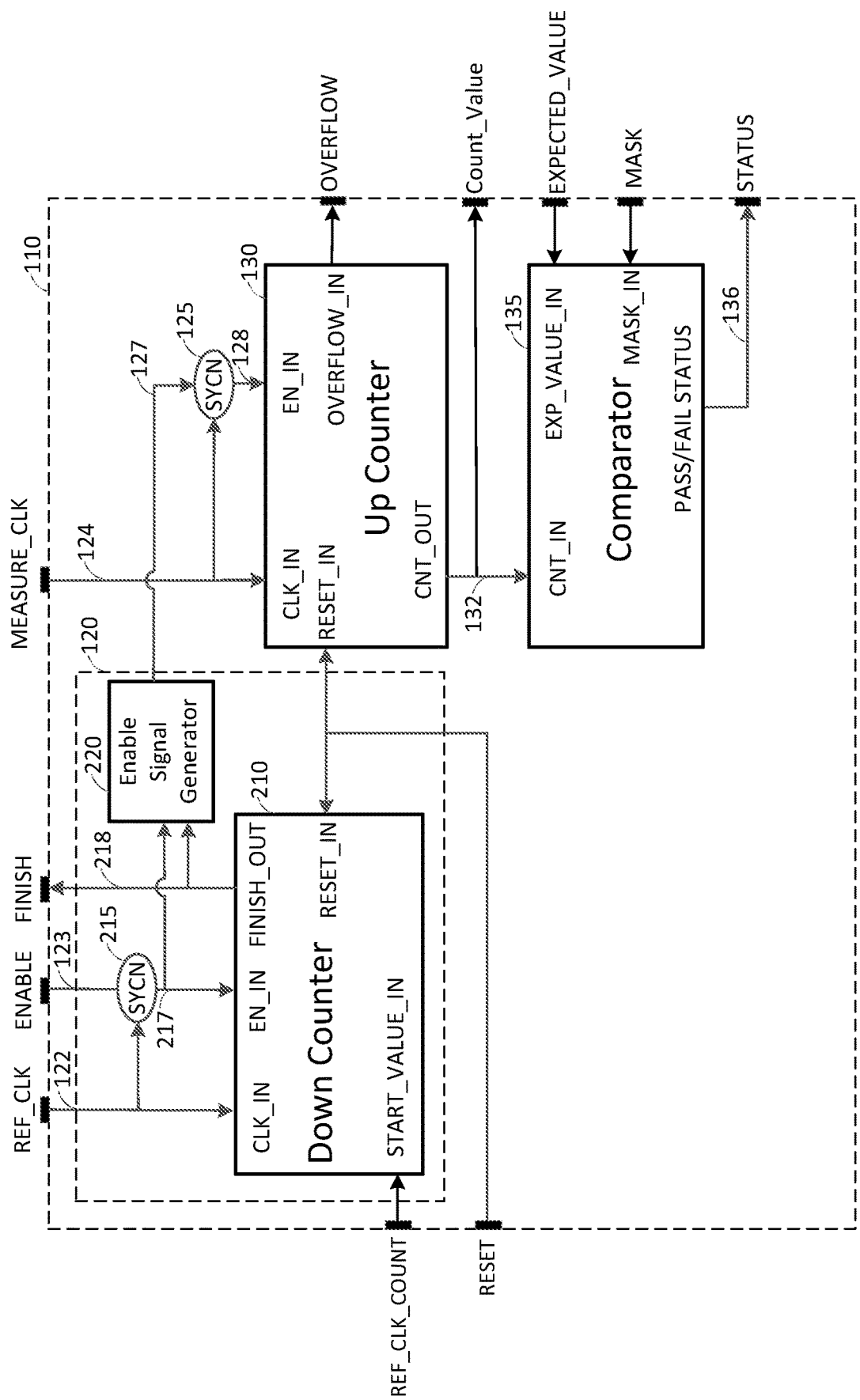
FIG. 2 shows an exemplary implementation of a count control device according to certain aspects of the present disclosure.

FIG. 2 shows an exemplary implementation of the count control device 120 according to certain aspects of the present disclosure. In this example, the count control device 120 includes a down counter 210, a synchronizer 215, and an enable signal generator 220.

The down counter 210 receives the reference clock signal 122 (labeled "REF_CLK") at a clock input (labeled "CLK_IN"). The synchronizer 215 synchronizes the input enable signal 123 (labeled "ENABLE") with the reference clock signal 122 to generate a synchronized input enable signal 217. For example, the synchronizer 215 may align an edge of the input enable signal 123 with an edge of the reference clock signal 122 to generate the synchronized input enable signal 217, as discussed further below. The down counter 210 receives the synchronized input enable signal 217 at an enable input (labeled "EN_IN"). The down counter 210 also receives the count control signal (labeled "REF_CLK_COUNT") at an input (labeled "START_VALUE_IN"), where the count control signal specifies the number of periods R of the reference clock signal 122 that defines the time duration (time window) discussed above. As discussed further below, the number R is used as a start count value for the down counter 210.

In operation, the down counter 210 starts counting down from the start count value of R when the synchronized input enable signal 217 is asserted (i.e., transitions from low to high). Since the down counter 210 runs off of the reference clock signal 122, the down counter 210 decrements its count value for each period (cycle) of the reference clock signal 122. When the count value of the down counter 210 reaches zero (i.e., the down counter 210 expires), the down counter 210 outputs a finish signal 218 from a finish output (labeled "FINISH_OUT"), where the finish signal 218 indicates that the down counter 210 is finished counting down to zero. The amount of time from the time the input enable signal 123 is asserted to the time the down counter 210 outputs the finish signal (i.e., down counter 210 expires) is approximately equal to R*p (i.e., the time duration discussed above). This is because the down counter 210 starts counting down from the start count value of R and runs off of the reference clock signal 122.

The enable signal generator 220 receives the synchronized input enable signal 217 from the synchronizer 215 and the finish signal 218 from the down counter 210. The enable signal generator 220 is configured to generate the count enable signal 127 for the up counter 130 based on the input enable signal 217 and the finish signal 218. More particularly, the enable signal generator 220 is configured to assert the count enable signal 127 (i.e., transition the count enable signal 127 from low to high) when the input enable signal 217 is asserted. This causes the up counter 130 to start counting when the input enable signal 217 is asserted. The enable signal generator 220 is configured to de-assert the count enable signal 127 (i.e., transition the count enable signal 127 from high to low) when the down counter 210 outputs the finish signal 218 (i.e., the down counter 210 expires). This causes the up counter 130 to stop counting when the down counter 210 outputs the finish signal 218 (i.e., the down counter 210 expires).

Thus, the count enable signal 127 is high from about the time the input enable signal 217 is asserted to the time the down counter 210 outputs the finish signal 218, which is approximately equal to the time duration (time window) discussed above. This causes the up counter 130 to count the number of periods (cycles) of the monitored clock signal over the time duration (time window) discussed above.

In the example in FIG. 2, the finish signal 218 from the down counter 210 is also output from the frequency monitor 110. Since the up counter 130 stops counting when the finish signal 218 is output, the finish signal 218 provides an indication that the frequency monitor 110 is about to output a status signal. For example, if the frequency monitor 110 outputs the status signal 136 to a monitor processor, then the frequency monitor 110 may also output the finish signal 218 to the monitor processor. When the monitor processor receives the finish signal 218, the monitor processor may look for the status signal from the frequency monitor 110.

In the example in FIG. 2, the down counter 210 and the up counter 130 are configured to receive a reset signal (labeled "RESET") at respective reset inputs (labeled "RESET_IN"). In this example, the down counter 210 may reset its count value to the start count value when the reset signal is asserted. The down counter 210 may also reset the logic value at the finish output (labeled "FINISH_OUT") to zero. In this example, the finish signal 218 has a logic value of one when the down counter 210 expires. The up counter 130 may reset its count value to zero when the reset signal is asserted. In certain aspects, a monitor processor may reset the down counter 210 and the up counter 130 after receiving a status signal from the frequency monitor 110 to initialize the down counter 210 and the up counter 130 for the next frequency measurement.

Figure 3:
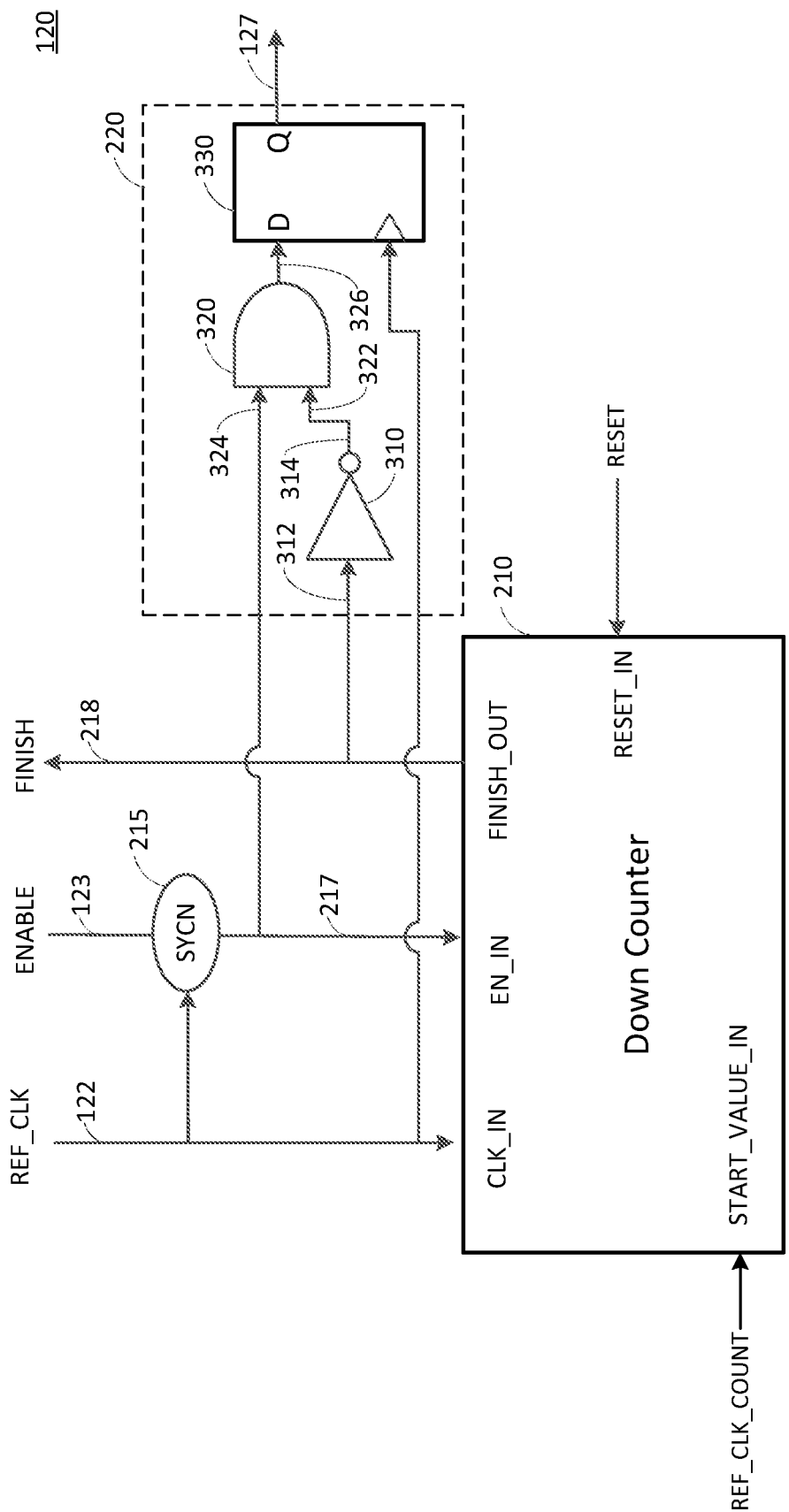
FIG. 3 shows an exemplary implementation of an enable signal generator according to certain aspects of the present disclosure.

FIG. 3 shows an exemplary implementation of the enable signal generator 220. In this example, the enable signal generator 220 includes an inverter 310, an AND gate 320, and a latch 330 (e.g., a flip-flop).

The input 312 of the inverter 310 is coupled to the finish output (labeled "FINISH_OUT") of the down counter 210. In the discussion below it is assumed that the finish signal has a logic value of one. The AND gate 320 has a first input 322 coupled to the output 314 of the inverter 310, a second input 324 coupled to the output of the synchronizer 215, and an output 326 coupled to an input (labeled "D") of the latch 330. The latch 330 has a clock input that receives the reference clock signal 122, and an output (labeled "Q") that outputs the count enable signal 127 for the up counter 130 (not shown in FIG. 3).

The latch 330 is configured to latch the logic value at the output 326 of the AND gate 320 on an edge of the reference clock signal 122, and output the latched logic value. When the latched logic value is high, the count enable signal 127 is asserted, in which case, the up counter 130 is enabled. When the latched logic value is low, the count enable signal 127 is de-asserted. The latch 330 may be positive-edge triggered, in which case, the latch 330 latches the logic value at the output 326 of the AND gate 320 on a rising edge of the reference clock signal 122. Alternatively, the latch 330 may be negative-edge triggered, in which case, the latch 330 latches the logic value at the output 326 of the AND gate 320 on a falling edge of the reference clock signal 122.

Initially, the input enable signal 123 (labeled "ENABLE") to the frequency monitor 110 is de-asserted (i.e., low). As a result, the second input 324 of the AND gate 320 is low. Also, the finish output (labeled "FINISH_OUT) of the down counter 210 is low, which is inverted to high by the inverter 310 and input to the first input 322 of the AND gate 320. As a result, the first input 322 of the AND gate 320 is high. Since one of the inputs of the AND gate 320 is low (i.e., the second input 324), the AND gate 320 outputs a logic zero. As a result, the count enable signal 127 is de-asserted (i.e., low).

When the input enable signal 123 is asserted (i.e., the input enable signal 123 becomes high), the second input 324 of the AND gate 320 becomes high. As a result, both inputs of the AND gate 320 are high, causing the AND gate 320 to output a logic one. The logic one is latched by the latch 330 and output at the output of the latch 330, causing the count enable signal 127 to be asserted (i.e., become high). Thus, the count enable signal 127 is asserted when the input enable signal 123 is asserted. This causes the up counter 130 to start counting periods (cycles) of the monitored clock signal 124, as discussed above. The down counter 210 also starts counting down from the start count value since the input enable signal 123 is asserted.

When the down counter 210 reaches zero (i.e., the down counter 210 expires), the down counter 210 outputs the finish signal 218. This causes the finish output (labeled "FINISH_OUT") of the down counter 210 to go high since the finish signal 218 has a logic value of one. Because the inverter 310 inverts the logic value at the finish output of the down counter 210, this causes the first input 322 of the AND gate 320 to go low. Since one of the inputs of the AND gate 320 is low (i.e., the first input 322), the AND gate 320 outputs a logic zero. The logic zero is latched by the latch 330 and output at the output of the latch 330, causing the count enable signal 127 to be de-asserted (i.e., become low). This causes the up counter 130 to stop counting. Thus, the count enable signal 127 is high from about the time the input enable signal 123 is asserted (i.e., becomes high) to the time the down counter 210 expires (i.e., finish signal 218 is outputted).

It is to be appreciated that the enable signal generator 220 is not limited to the exemplary implementation shown in FIG. 3, and may be implemented using other combinations of logic gates.

Figure 4:
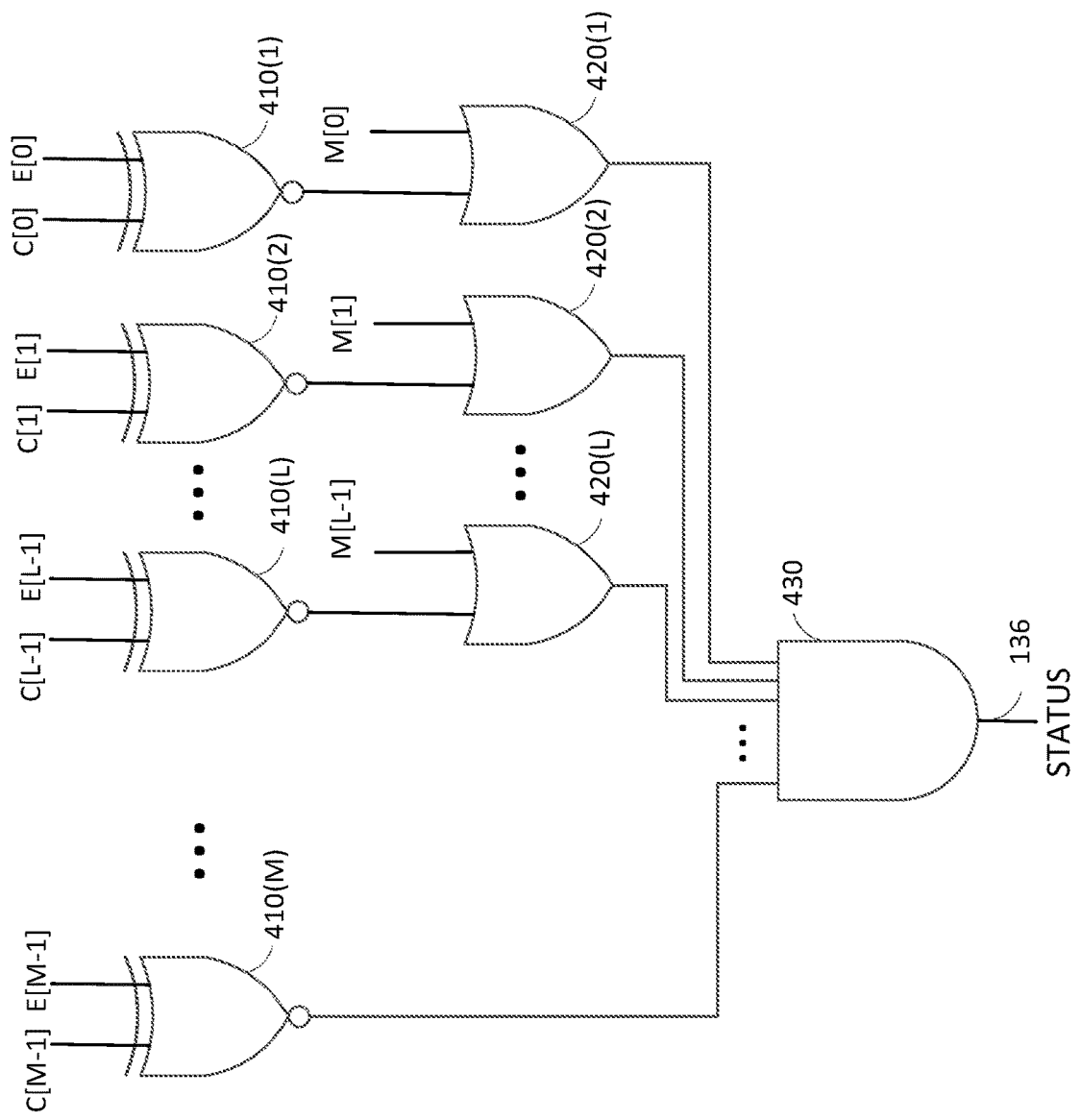
FIG. 4 shows an exemplary implementation of a comparator according to certain aspects of the present disclosure.

FIG. 4 shows an exemplary implementation of the comparator 135 according to certain aspects of the present disclosure. In this example, the comparator 135 includes multiple XNOR gates 410(1)-410(M), in which each XNOR gate receives a respective bit of the count value 132 and a respective bit of the expected count value. For example, the first XNOR gate 410(1) receives the first bit of the count value 132 (denoted "C[0]") and the first bit of the expected count value (denoted "E[0]"), the second XNOR gate 410(2) receives the second bit of the count value 132 (denoted "C[1]") and the second bit of the expected count value (denoted "E[1]"), and so forth. The last XNOR gate 410(M) receives the Mth bit of the count value 132 (denoted "C[M−1]") and the Mth bit of the expected count value (denoted "E[M−1]"). Each XNOR gate functions as a one-bit comparator that outputs a logic one if the respective bit of the count value 132 matches the respective bit of the expected count value, and outputs a logic zero if the respective bit of the count value 132 does not match the respective bit of the expected count value.

Thus, if the count value matches the expected value, then all of the XNOR gates 410(1)-410(M) output a logic one. If the count value and the expected value do not match, then one or more of the XNOR gates 410(1)-410(M) output a logic zero.

The comparator 135 also includes multiple OR gates 420(1)-420(L), and an AND gate 430. Each OR gate has one input coupled to an output of a respective one of the XNOR gates, a second input that receives a respective bit of the mask control signal, and an output coupled to a respective input of the AND gate 430. As shown in FIG. 4, the OR gates are coupled to the XNOR gates corresponding to the L LSBs of the count value and the L LSBs of the expected count value. The output of each of the remaining XNOR gates may be coupled directly to a respective input of the AND gate 430.

Each OR gate is configured to either pass or mask out the output of the respective XNOR gate depending on the value of the respective bit of the mask control signal. If the respective bit of the mask control signal is zero, then the OR gate passes the output of the respective XNOR gate to the respective input of the AND gate 430. In this case, the corresponding bit of the count value 132 and the corresponding bit of the expected count value are not masked out. If the respective bit of the mask control signal is one, then the OR gate outputs a one to the respective input of the AND gate 430 regardless of the logic value at the output of the respective XNOR gate. This effectively masks out the corresponding bit of the count value 132 and the corresponding bit of the expected count value.

In the example shown in FIG. 4, the mask control signal incldes L bits (denoted M[0] to M[L−1]), in which the value of each bit of the mask control signal corresponds to a respective bit of the count value and a respective bit of the expected count value. For example, the first mask bit M[0] corresponds to the first bit C[0] of the count value 132 and the first bit E[0] of the expected count value. If the first mask bit M[0] is zero, then the corresponding OR gate 420(1) passes the output of the corresponding XNOR gate 410(1) to the respective input of the AND gate 430. In this case, the first bit C[0] of the count value 132 and the first bit E[0] of the expected count value are not masked out. If the first mask bit M[0] is one, then the corresponding OR gate 420(1) outputs a one regardless of the logic value at the output of the corresponding XNOR gate 410(1) (and hence regardless of whether the first bit C[0] of the count value 132 matches the first bit E[0] of the expected count value). In this case, the first bit C[0] of the count value 132 and the first bit E[0] of the expected count value are masked out.

In this example, there are L OR gates 420(1)-420(L) and the mask control signal has L bits. Thus, in this example, the maximum number of LSBs that can be masked out is L, which occurs when the bits of the mask control signal are all ones. As discussed above, the number of LSBs that are masked out is N. Thus, in this example, N has a maximum value of L, which occurs when the bits of the mask control signal are all ones.

The status signal 136 (labeled "STATUS") is output from the output of the AND gate 430. The AND gate 430 outputs a pass status signal (i.e., logic one) if all of the inputs of the AND gate 430 are ones. This occurs when all of the unmasked bits of the count value 132 match the unmasked bits of the expected count value, regardless of whether the masked bits of the count value 132 match the masked bits of the expected count value. This is because the OR gates corresponding to the masked bits output ones to the AND gate 430. The AND gate 430 outputs a fail status signal (i.e., logic zero) if one or more of the inputs of the AND gate 430 are zero. This occurs when the unmasked bits of the count value 132 do not match the unmasked bits of the expected count value.

As discussed above, the synchronizer 125 synchronizes the count enable signal 127 to the up counter 130 with the monitored clock signal 124. This is done to prevent glitches in the frequency monitor 110 that occur when the count enable signal 127 output by the count control device 120 is asynchronous with the monitored clock signal 124. By synchronizing the count enable signal 127 with the monitored clock signal 124 before the count enable signal 127 is input to the up counter 130, these glitches are prevented.

As discussed above, the synchronizer 215 synchronizes the input enable signal 123 (labeled "ENABLE") with the reference clock signal 122. This is done to prevent glitches in the frequency monitor 110 that occur when the input enable signal 123 is asynchronous with the reference clock signal 122. By synchronizing the input enable signal 123 with the reference clock signal 122 before the input enable signal is input to the down counter 210, these glitches are prevented.

The synchronizer 125 adds a very short delay to the count enable signal 127. Similarly, the synchronizer 215 adds a very short delay to the input enable signal. In the above description of the frequency monitor 110, these short delays were neglected for ease of discussion.

Figure 5:
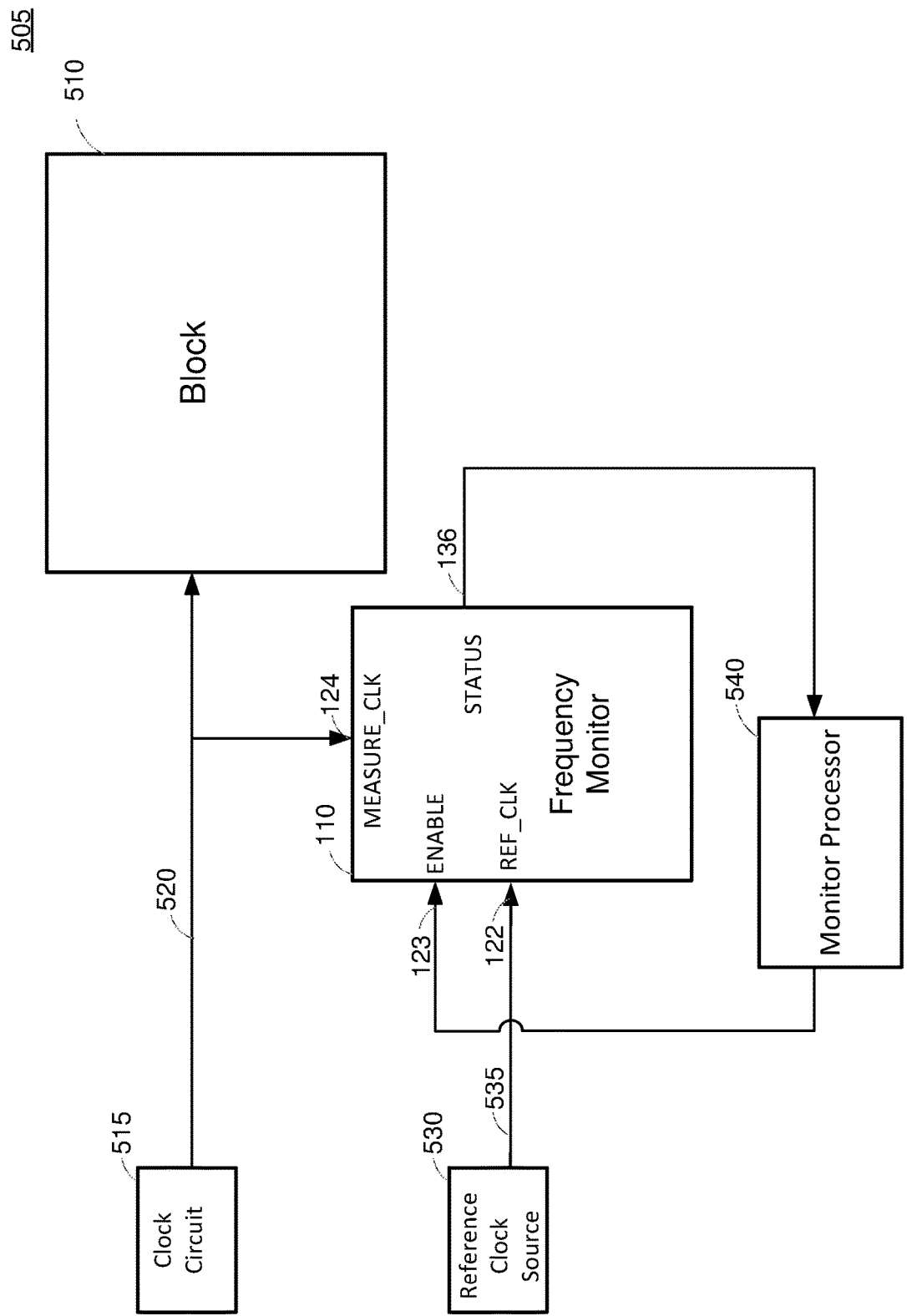
FIG. 5 shows an example in which the frequency monitor is used to monitor the frequency of a clock signal for a block according to certain aspects of the present disclosure.

As discussed above, the frequency monitor 110 may be used to monitor the frequency of a clock signal of a block (e.g., CPU) located on the same chip as the frequency monitor 110. In this regard, FIG. 5 shows an example of a system 505 including a block 510 (e.g., CPU), a monitor processor 540, a clock circuit 515, a reference clock source 530, and the frequency monitor 110. For ease of illustration, details of the frequency monitor 110 are not shown in FIG. 5. The block 510, the clock circuit 515 and the frequency monitor 110 may be located on the same chip.

The clock circuit 515 is configured to generate the clock signal for the block 510, and may include a phase locked loop (PLL). The clock signal is delivered to the block 510 via a clock line 520, which may include one or more buffers (not shown).

The clock signal input to the block 510 is also input to the clock measurement input (labeled "MEASURE_CLK") of the frequency monitor 110 to monitor the frequency of the clock signal. In this regard, the frequency monitor 110 may be coupled to the clock line 520 at or close to the block 510 so that the frequency monitor 110 accurately measures the frequency of the clock signal received at the block 510. Thus, in this example, the monitored clock signal 124 corresponds to the clock signal received by the block 510.

The reference clock source 530 is configured to generate the reference clock signal 122, which may have a lower frequency than the clock signal input to the block 510. The reference clock source 530 may include a crystal oscillator or another clock source with a well-defined frequency. The reference clock source 530 may be located on the same chip as the frequency monitor 110 or on a different chip. The reference clock signal 122 is input to the reference clock input (labeled "REF_CLK") of the frequency monitor 110 via clock line 535.

The monitor processor 540 is configured to monitor the frequency of the clock signal of the block 510 using the frequency monitor 110 to verify that the frequency of the clock signal meets a specification. As shown in FIG. 5, the monitor processor 540 is coupled to the enable input (labeled "ENABLE") of the frequency monitor 110, and the status output (labeled "STATUS") of the frequency monitor 110.

Although not shown in FIG. 5, it is to be understood that the monitor processor 540 may also be coupled to other inputs and/or outputs of the frequency monitor 110 shown in FIGS. 1 and 2. For example, the monitor processor 540 may be coupled to the mask input of the frequency monitor 110 (shown in FIGS. 1 and 2) to program the number of LSBs that are masked out. The monitor processor 540 may also be coupled to the expected count value input of the frequency monitor 110 (shown in FIGS. 1 and 2) to program the expected count value. The monitor processor 540 may also be coupled to the count control input of the frequency monitor 110 (shown in FIG. 2) to program the start count value of the down counter 210.

In operation, the monitor processor 540 checks the status of the clock signal of the block 510 by asserting the input enable signal 123 to the frequency monitor 110. In response, the frequency monitor 110 measures the frequency of the clock signal 124, as discussed above, and outputs a status signal 136 indicating whether the clock signal passes or fails. As discussed above a pass indicates that the frequency of the clock signal is within a certain frequency range, and a fail indicates that the frequency of the clock signal is outside the frequency range. The frequency range is a function of the number of LSBs that are masked out and the expected count value.

If the status signal 136 indicates a pass, then the monitor processor 540 may check the clock signal again at a later time. If the status signal 136 indicates a fail, then the monitor processor 540 may take appropriate action. For example, if the block 510 performs one or more driver assistance operations in an advanced driver assistance system (ADAS), then the monitor processor 540 may alert the driver (e.g., via a display) that the ADAS is unable to properly perform the one or more affected driver assistance operations. This way, the driver stops relying on the ADAS to perform these operations, and can take corrective action.

In certain aspects, the monitor processor 540 may be configured to periodically check the status of the clock signal of the block 510 during run time. For example, the monitor processor 540 may check the status of the clock signal at a rate of once every 10 milliseconds to once every one second. For each status check, the monitor processor 540 asserts the input enable signal 123 to the frequency monitor 110, and receives a status signal 136 from the frequency monitor 110 in response, where the status signal 136 indicates whether the frequency of the clock signal 124 meets the specification.

Each time the monitor processor 540 finishes a status check for the clock signal (i.e., receives a status signal), the monitor processor 540 may reset the frequency monitor 110 to initialize the frequency monitor 110 for the next status check. In this regard, the monitor processor 540 may be coupled to the reset input of the frequency monitor 110 (shown in FIG. 2), and reset the frequency monitor after each clock status check. The monitor processor 540 may also de-assert the enable signal 123 after each status check. In this case, the monitor processor 540 re-asserts the enable signal 123 when it is time for the next status check.

In certain aspects, the monitor processor 540 may be coupled to the count value output of the frequency monitor 110 (labeled "Count_Value" in FIG. 1). This allows the monitor processor 540 to receive the count value 132 from the up counter 130, which provides a digital measurement of the frequency of the monitored clock signal 124, as discussed above.

Figure 6:
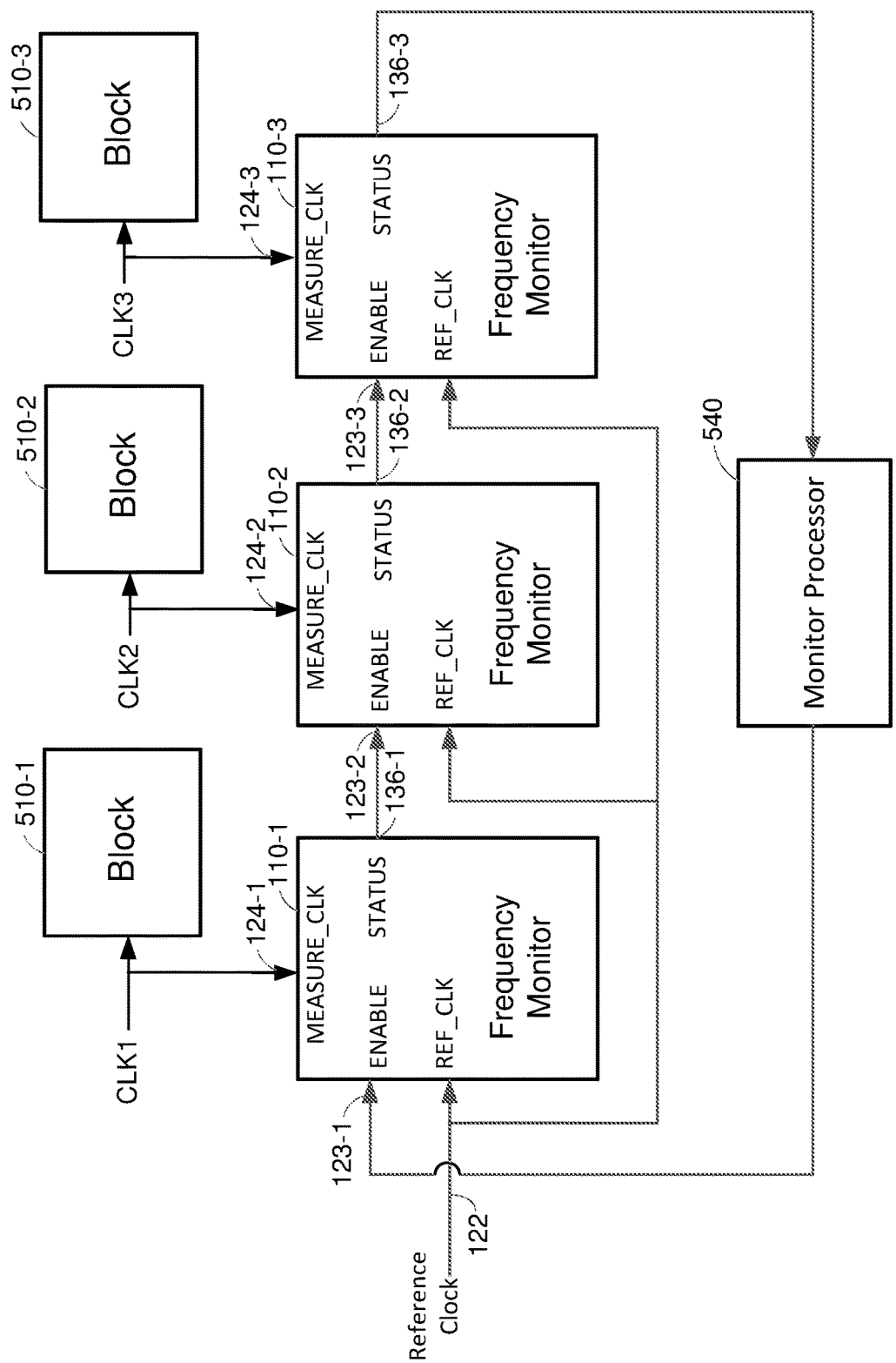
FIG. 6 shows an example of multiple frequency monitors coupled in a daisy chain to monitor clock signals for multiple blocks according to certain aspects of the present disclosure.

Multiple copies of the frequency monitor 110 may be placed on a system on a chip (SoC) to monitor the clock frequencies of multiple blocks on the SoC. In this regard, FIG. 6 shows an exemplary configuration 605 of multiple frequency monitors 110-1 to 110-3 for monitoring the clock frequencies of multiple blocks 510-1 to 510-3 on an SoC. Each frequency monitor may be implemented using the exemplary frequency monitor shown in FIG. 1.

In FIG. 6, each of the frequency monitors 110-1 to 110-3 receives a reference clock signal 122 at the respective reference clock input (labeled "REF_CLK"). The reference clock signal 122 may come from a common reference clock source (e.g., reference clock source 530) via a clock tree. Further, each of the frequency monitors 110-1 to 110-3 receives a clock signal 124-1 to 124-3 for a respective one of the multiple blocks 510-1 to 510-3. More particularly, frequency monitor 110-1 receives a first clock signal 124-1 (labeled "CLK1") for block 510-1 at the respective clock measurement input (labeled "MEASURE_CLK"), frequency monitor 110-2 receives a second clock signal 124-2 (labeled "CLK2") for block 510-2 at the respective clock measurement input (labeled "MEASURE_CLK"), and frequency monitor 110-3 receives a third clock signal 124-3 (labeled "CLK3") for block 510-3 at the respective clock measurement input (labeled "MEASURE_CLK"). The clock signals 124-1 to 124-3 may have the same frequency or different frequencies. The blocks 510-1 to 510-3 may include one or more central processing units (CPUs), a modem, a graphics processing unit (GPU), a digital signal processor, or any combination thereof.

The SoC includes the monitor processor 540, which is configured to check whether the clock signals 124-1 to 124-3 meet a specification using the frequency monitors 110-1 to 110-3. In the example shown in FIG. 6, the frequency monitors 110-1 to 110-3 are coupled in a daisy chain, in which the enable input 123-1 of frequency monitor 110-1 is coupled to the monitor processor 540, the status output 136-1 of frequency monitor 110-1 is coupled to the enable input 123-2 of frequency monitor 110-2, the status output 136-2 of frequency monitor 110-2 is coupled to the enable input 123-3 of frequency monitor 110-3, and the status output 136-3 of frequency monitor 110-3 is coupled back to the monitor processor 540.

The status signal 136-1 of frequency monitor 110-1 serves as the input enable signal 123-2 for frequency monitor 110-2. Since the status signal 136-1 has a logic value of one for a pass and an enable signal 123-2 has a logic value of one, frequency monitor 110-2 is enabled when the status signal 136-1 from the frequency monitor 110-1 is a pass. When the status signal 136-1 from frequency monitor 110-1 is a fail, frequency monitor 110-2 is not enabled.

Similarly, the status signal 136-2 from frequency monitor 110-2 serves as the input enable signal 123-3 for frequency monitor 110-3. Thus, frequency monitor 110-3 is enabled when the status signal 136-2 from frequency monitor 110-2 is a pass, and is not enabled when the status signal 136-2 from frequency monitor 110-2 is a fail.

In operation, the monitor processor 540 checks the clock signals 124-1 to 124-3 by asserting the enable signal 123-1 to the enable input of frequency monitor 110-1, which is the first frequency monitor 110-1 in the daisy chain. This causes frequency monitor 110-1 to monitor the first clock signal 124-1 and output a status signal 136-1 indicating whether the first clock signal 124-1 passes or fails. If the status signal 136-1 from frequency monitor 110-1 indicates a pass, then frequency monitor 110-2 is enabled. This causes frequency monitor 110-2 to monitor the second clock signal 124-2 and output a status signal 136-2 indicating whether the second clock signal 124-2 passes or fails. If the status signal 136-2 from frequency monitor 110-2 is a pass, then frequency monitor 110-3 is enabled. This causes frequency monitor 110-3 to monitor the third clock signal 124-3 and output a status signal 136-3 to the monitor processor 540 indicating whether the third clock signal 124-3 passes or fails.

In this example, the monitor processor 540 only receives a pass status signal from the last frequency monitor 110-3 in the daisy chain if all of the clock signals 124-1 to 124-3 pass. This is because frequency monitor 110-3 outputs a fail status signal if the third clock signal 124-3 fails. Also, frequency monitor 110-3 outputs a logic zero to the monitor processor 540 (which is logically equivalent to a fail status signal) if frequency monitor 110-3 is not enabled, which occurs if the first clock signal 124-1, the second clock signal 124-2, or both fail. Thus, the monitor processor 540 determines that all of the clock signals meet the specification if the monitor processor 540 receives a pass status signal from the last frequency monitor 110-3 in the daisy chain. The monitor processor 540 determines that one or more of the clock signals fails if the monitor processor 540 fails to receive a pass status signal from the last frequency monitor 110-3 in the daisy chain. In this case, the monitor processor 540 may take appropriate action. For example, if the blocks 510-1 to 510-3 perform driver assistance operations in an advanced driver assistance system (ADAS), then the monitor processor 540 may alert the driver (e.g., via a display) that the ADAS is unable to properly perform the one or more affected driver assistance operations.

In certain aspects, the monitor processor 540 may be configured to periodically check the status of the clock signals of the blocks 510-1 to 510-3 during run time. For example, the monitor processor 540 may check the status of the clock signals at a rate of once every 10 milliseconds to once every one second. For each status check, the monitor processor 540 asserts the input enable signal 123-1 to the first frequency monitor 110-1 in the daisy chain, and monitors the status output of the last frequency monitor 110-3 in the daisy chain. If the monitor processor 540 receives a pass status signal from the last frequency monitor 110-3 in the daisy chain, then the monitor processor 540 determines that the clock signals meet the specification. If the monitor processor 540 does not receive a pass status signal (i.e., the status output of the last frequency monitor 110-3 stays at logic zero), then the monitor processor 540 determines that one or more of the clock signals to do not meet the specification.

Thus, the daisy chain topology illustrated in FIG. 6 allows the monitor processor 540 to check the clock signals of multiple blocks 510-1 to 510-3. Although three frequency monitors 110-1 to 110-3 are shown in the example in FIG. 6, it is to be appreciated that a larger number of frequency monitors may be connected into the daisy chain to monitor a larger number of clock signals (i.e., the daisy chain topology is scalable). Although, the blocks 510-1 to 510-3 appear close together in FIG. 6 for ease of illustration, it is to be appreciated that the blocks may be placed anywhere on the SoC with respect to one another.

Figure 7:
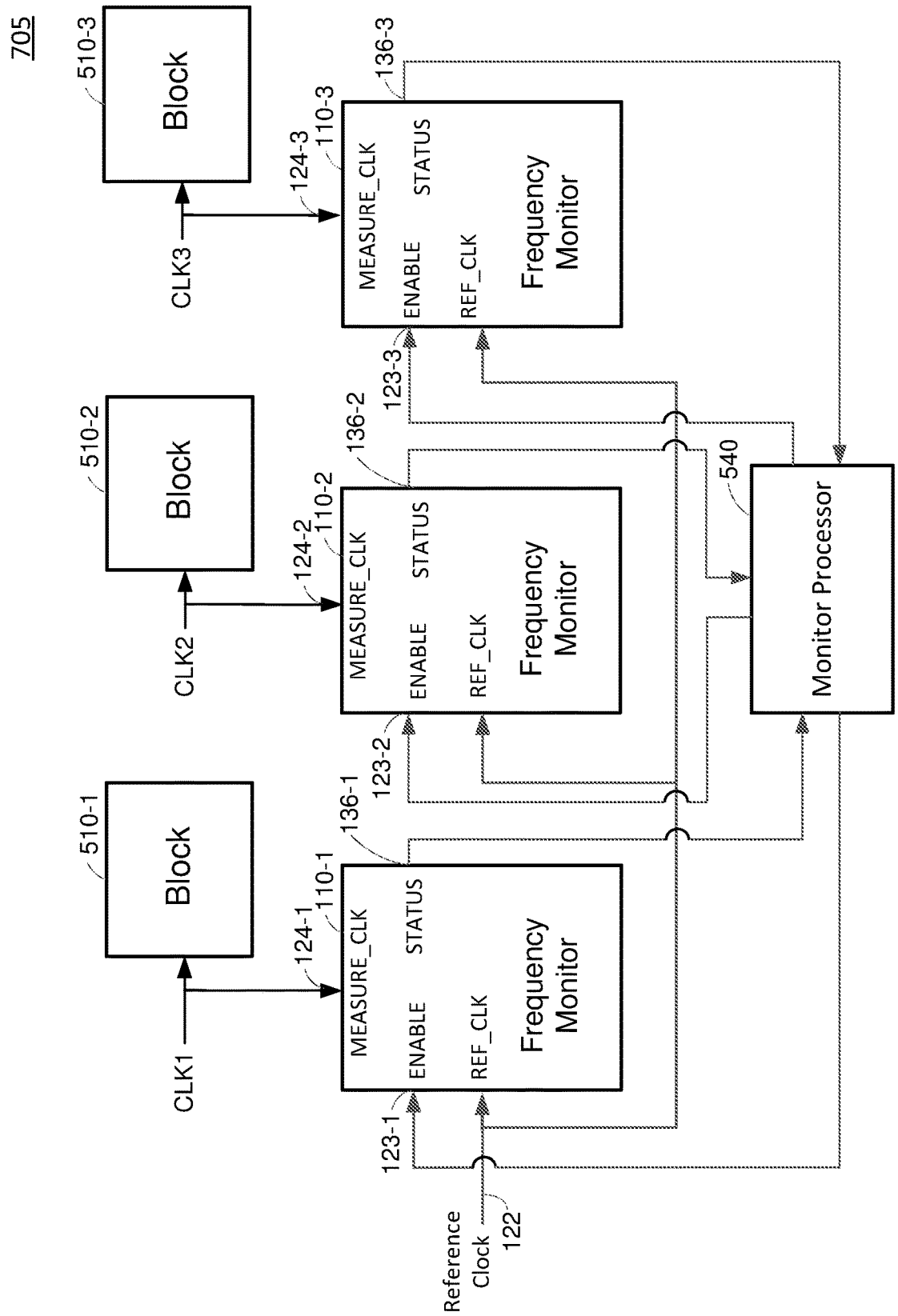
FIG. 7 shows an example of multiple frequency monitors coupled to a monitor processor according to certain aspects of the present disclosure.

FIG. 7 shows another exemplary configuration 705 of the multiple frequency monitors 110-1 to 110-3 according to aspects of the present disclosure. As discussed above, each frequency monitor may be implemented using the exemplary frequency monitor shown in FIG. 1.

In this example, the monitor processor 540 is separately coupled to the enable input 123-1 to 123-3 of each frequency monitor 110-1 to 110-3, and separately coupled to the status output 136-1 to 136-3 of each frequency monitor 110-1 to 110-3. This allows the monitor processor 540 to independently monitor the clock signal of each block 510-1 to 510-3. To check the clock status of a particular block, the monitor processor 540 asserts the input enable signal for the respective frequency monitor, and, in response, receives a status signal from the respective frequency monitor indicating whether the clock signal of the block passes or fails. In this example, the monitor processor 540 may check the clock status of the blocks one at a time or contemporaneously.

In certain use cases of the SoC, one or more of the blocks 510-1 to 510-3 may not be used. In these cases, the one or more blocks may be disabled to conserve power. A block may be disabled by gating the clock signal to the block and/or collapsing the supply voltage of the block. In these cases, the monitor processor 540 may skip checking the clock status of the one or more disabled blocks, and only check the clock status of one or more enabled blocks. For example, if block 510-1 is disabled and blocks 510-2 and 510-3 are enabled for a particular use case (e.g., application), then the monitor processor 540 may skip checking the clock status of block 510-1 and periodically check the clock status of blocks 510-2 and 510-3.

Figure 8A:
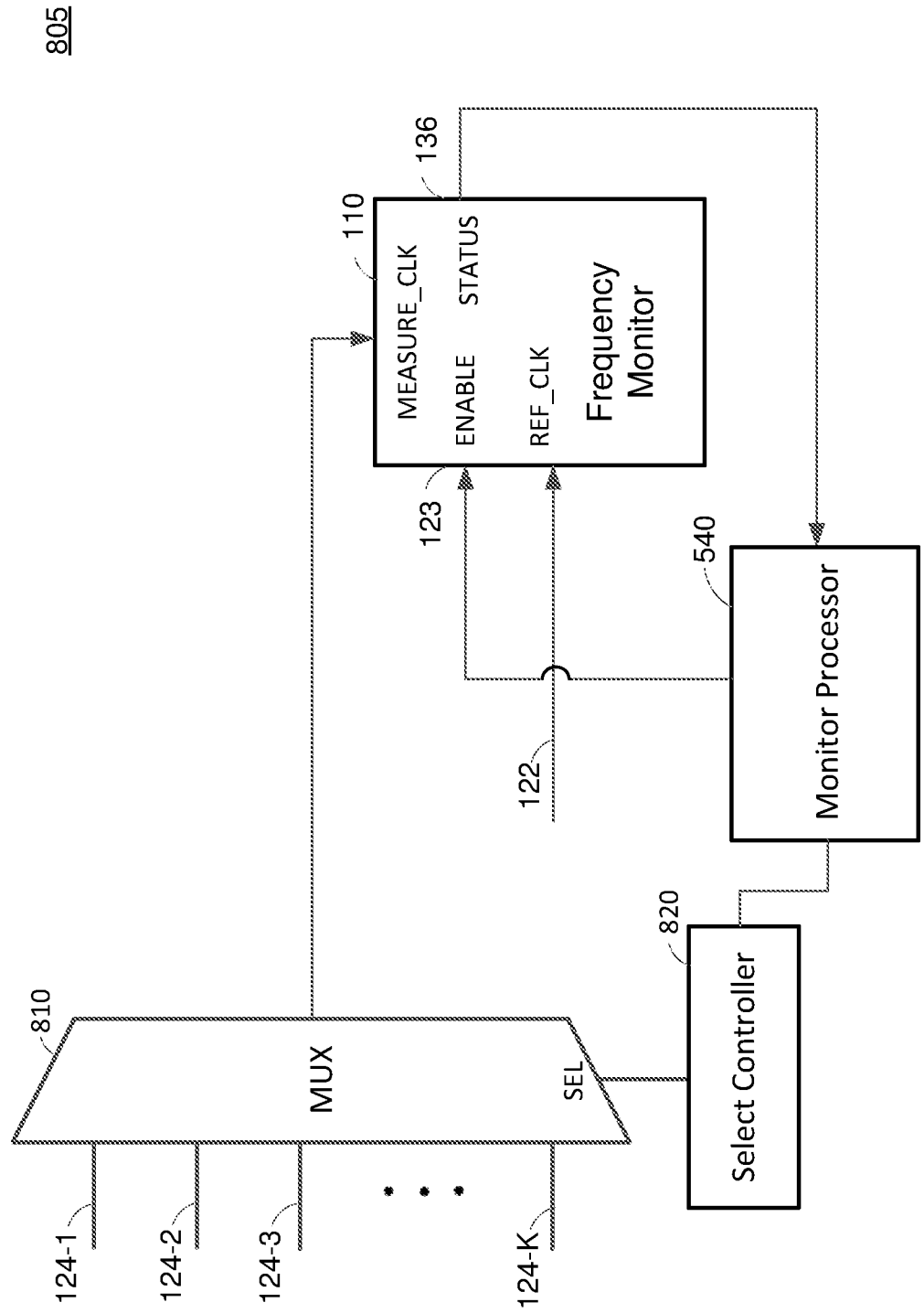
FIG. 8A shows an example of a multiplexer configured to couple clock signals to a frequency monitor one at a time according to certain aspects of the present disclosure.

FIG. 8A shows an exemplary configuration in which one frequency monitor 110 is used to monitor multiple clock signals 124-1 to 124-K on an SoC according to certain aspects. In this example, the SoC includes a multiplexer 810 and a select controller 820. The multiplexer 810 has multiple inputs and an output, in which each of the inputs is coupled to a respective one of the clock signals 124-1 to 124-K and the output is coupled to the clock measurement input (labeled "MEASURE_CLK") of the frequency monitor 110.

Each of the clock signals 124-1 to 124-K may correspond to a different one of multiple blocks on the SoC.

The multiplexer 810 is configured to selectively couple the multiple clock signals 124-1 to 124-K to the clock measurement input of the frequency monitor 110 one at a time under the control of the select controller 820. The monitor processor 540 is coupled to the select controller 820, the enable input (labeled "ENABLE") of the frequency monitor 110, and the status output (labeled "STATUS") of the frequency monitor 110.

In operation, the select controller 820 instructs the multiplexer 810 to sequentially couple each of the clock signals 124-1 to 124-K to the frequency monitor 110. For each clock signal, the select controller 820 may output a select signal to the monitor processor 540 indicating that the clock signal is currently selected and coupled to the frequency monitor. In response to the select signal for each clock signal, the monitor processor 540 checks the status of the clock signal by asserting the input enable signal 123 of the frequency monitor 110, and receiving a status signal 136 from the frequency monitor 110 indicating whether the clock signal passes or fails. A pass indicates that the clock signal is within a respective frequency range, which is function of the number of LSBs that are masked out and the respective expected count value. A fail indicates that the clock signal is outside the respective frequency range. Thus, in this example, the monitor processor 540 checks the status of each of the clock signals 124-1 to 124-K one at a time using the frequency monitor 110.

In some cases, it may be desirable to only check the status of a subset of the clock signals 124-1 to 124-K. For example, in a certain use case (e.g., application), one or more blocks on the SoC may be disabled, in which case the clock signals corresponding to the one or more disabled blocks may be skipped. In this example, the select controller 820 instructs the multiplexer 810 to sequentially couple each clock signal in a subset of the clock signals 124-1 to 124-K to the frequency monitor 110, in which the subset excludes the clock signals being skipped. For each clock signal in the subset, the select controller 820 may output a select signal to the monitor processor 540 indicating that the clock signal is currently selected and coupled to the frequency monitor. In response to the select signal for each clock signal in the subset, the monitor processor 540 checks the status of the clock signal by asserting the input enable signal 123 of the frequency monitor 110, and receiving a status signal 136 from the frequency monitor 110 indicating whether the clock signal passes or fails. Thus, in this example, the monitor processor 540 checks the status of each of the clock signals in the subset one at a time.

In another example, the SoC may be incorporated into a system (e.g., ADAS) that does not use one or more of the blocks of the SoC. In this example, the select controller 820 may skip the clock signals of the one or more blocks not being used in the system.

Figure 8B:
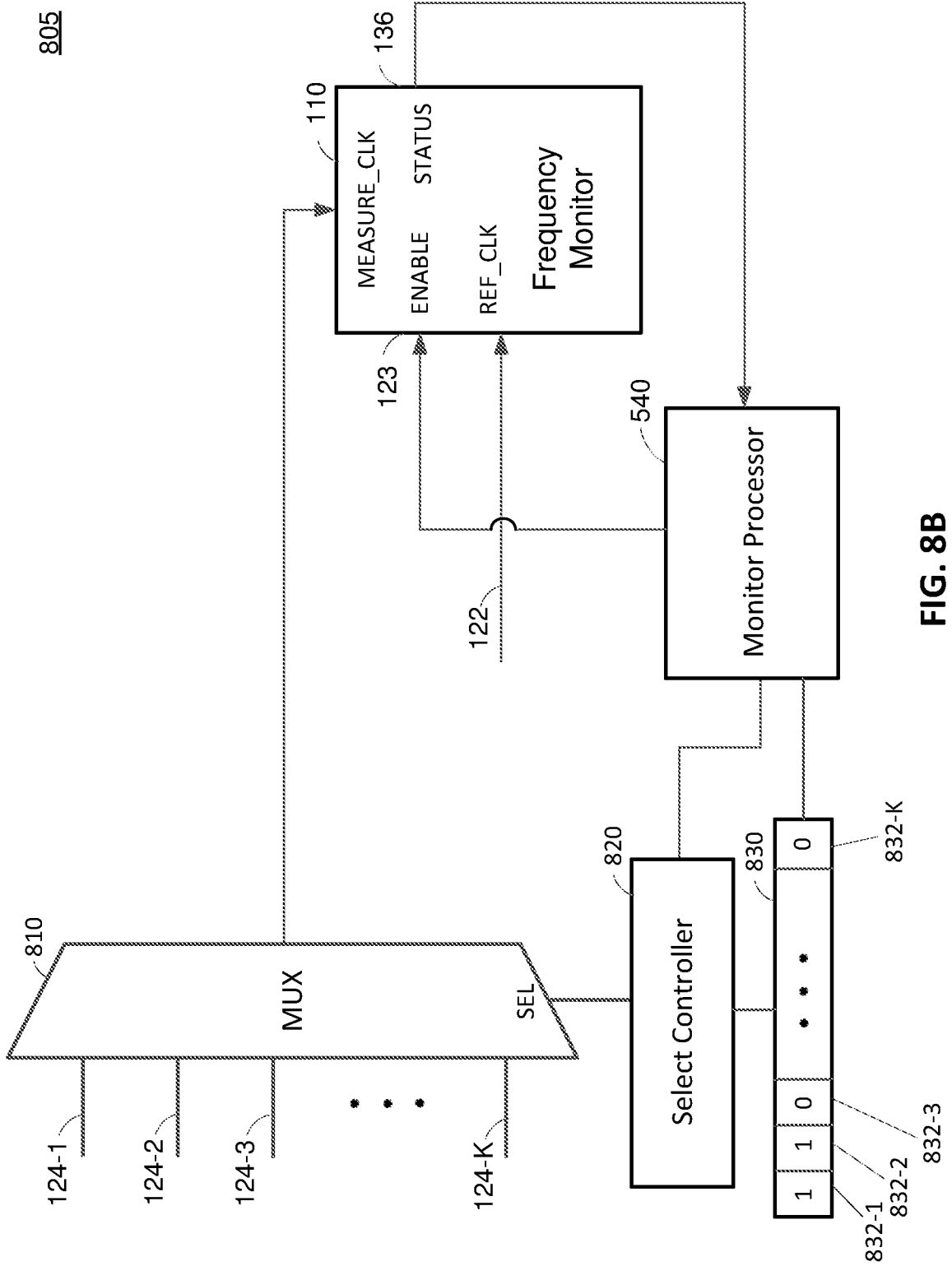
FIG. 8B shows an example of a register that stores a set of monitor indicators specifying a subset of clock signals to be monitored according to certain aspects of the present disclosure.

As discussed above, the select controller 820 may select only a subset of the clock signals 124-1 to 124-K for monitoring instead of all of the clock signals 124-1 to 124-K. In certain aspects, the subset of clock signals may be programmed (e.g., by the monitor processor 540 or another device) using a register. In this regard, FIG. 8B shows an example in which the SoC also include a list register 830 for programming the subset of clock signals to be monitored. The list register 830 include multiple slots 832-1 to 832-K, in which each slot corresponds to a respective one of the clock signals 124-1 to 124-K. Each slot stores a monitor indicator that indicates whether the respective clock signal is in the subset to be monitored. The monitor indicators may be programmed by the monitor processor 540 or another device according to a desired subset.

For example, the monitor indicator in each slot may include a bit, in which the value of the bit indicates whether the respective clock signal is in the subset. In this example, a bit value of one may indicate that the respective clock signal is in the subset, and a bit value of zero may indicate that the respective clock signal is not in the subset (i.e., the respective clock signal is to be skipped). In the example shown in FIG. 8B, the slot 832-1 corresponding to clock signal 124-1 stores a bit value of one, indicating that clock signal 124-1 is in the subset to be monitored. In contrast, the slot 832-3 corresponding to clock signal 124-3 stores a bit value of zero, indicating that clock signal 124-3 is not in the subset.

In operation, the select controller 820 sequentially couples each of the clock signals 124-1 to 124-K in the subset to the frequency monitor 110 using the multiplexer 810, in which the subset is specified by the monitor indicators in the register 830. Using the example in which each monitor indicator is a bit, the select controller 820 sequentially couples each of the clock signals corresponding to a monitor indicator having a bit value of one. In this example, the select controller 820 skips each of the clock signals corresponding to a monitor indicator having a bit value of zero.

Thus, the subset of clock signals to be monitored may be programmed by programming the values of the monitor indicators in the register 830 according to the subset. Using the example in which each monitor indicator is a bit, the subset may be programmed by programming a bit value of one for each monitor indicator in the register 830 corresponding to a clock signal in the subset, and programming a bit value of zero for each of the remaining monitor indicators in the register 830.

In certain aspects, the select controller 820 is configured to cycle through the clock signals in the subset. For example, the select controller 820 may sequentially couple each of the clock signals 124-1 to 124-K in the subset to the frequency monitor 110 using the multiplexer 810, where the subset is specified by the monitor indicators in the register 830. After going through all of the clock signals in the subset, the select controller 820 repeats the above step (i.e., sequentially couple each of the clock signals in the subset to the frequency monitor).

In this example, the select controller 820 may receive a monitor enable signal (e.g., from the monitor processor 540 or another device). When the monitor enable signal is asserted (e.g., logic one), the select controller 820 cycles through the clock signals in the subset specified by the monitor indicators in the register 830, as discussed above. When the monitor enable signal is de-asserted (e.g., logic zero), the select controller 820 suspends (halts) sequentially coupling the clock signals in the subset to the frequency monitor 110. For example, the monitor enable signal may be de-asserted when the register 830 is being re-programed for a new subset of clock signals to be monitored. After the re-programming is complete, the monitor enable signal may be asserted so that the select controller 810 can start cycling through the clock signals in the new subset.

Figure 8C:
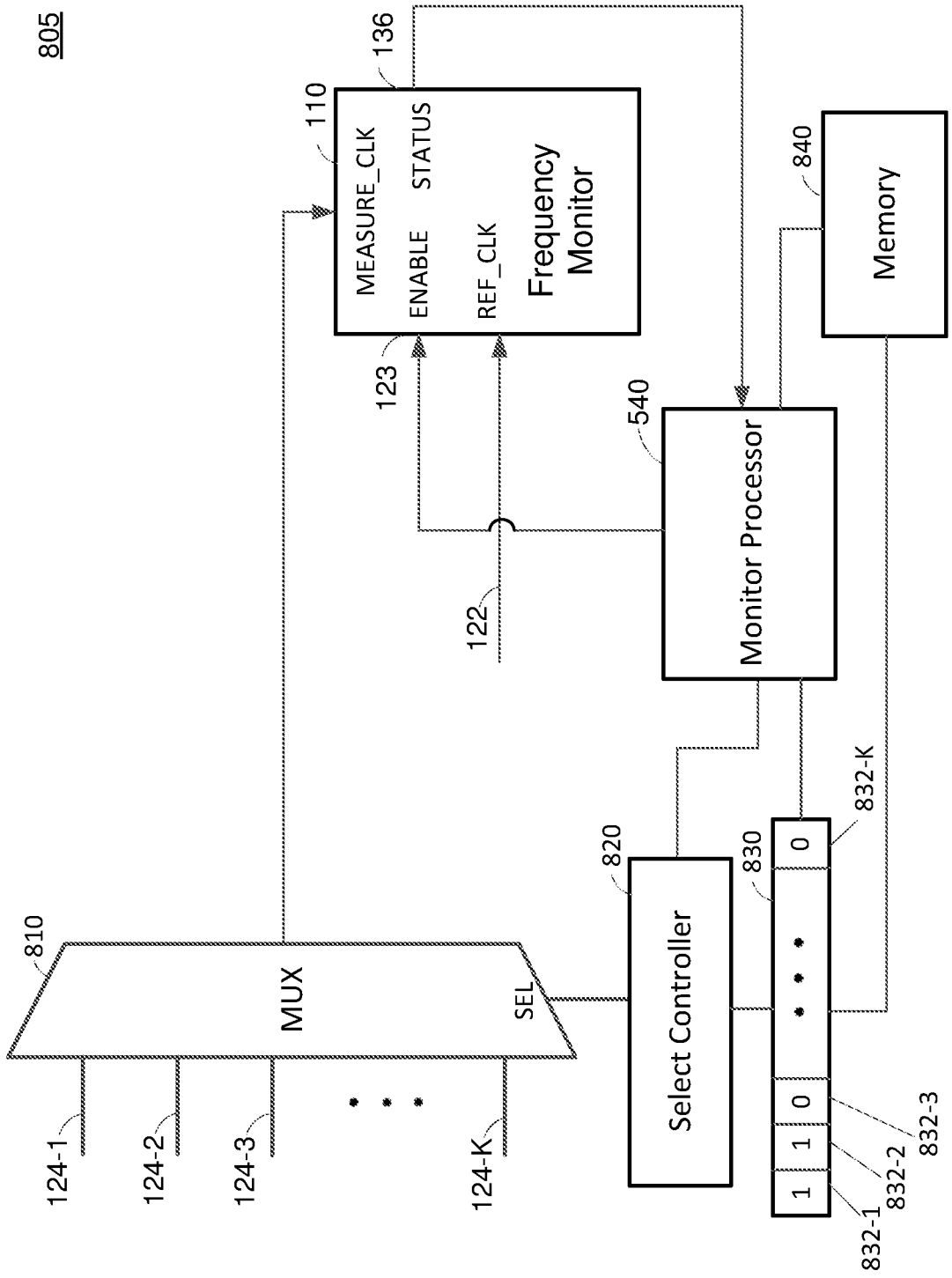
FIG. 8C shows an example of a memory that stores multiple sets of monitor indicators specifying different subsets of the clock signals according to certain aspects of the present disclosure.

In certain aspects, the monitor processor 540 may dynamically change the subset of clock signals that are monitored depending, for example, on a mode of operation of the SoC. In this regard, FIG. 8C shows an example in which the SoC includes a memory 840 that stores multiple sets of monitor indicators. In this example, SoC may operate in any one of multiple modes of operation, and each set of monitor indicators may specify a subset of clock signals to be monitored for a respective one of the multiple modes of operation.

In this example, the monitor processor 540 may receive a signal indicating the current mode of operation of the SoC (e.g., from an operating system of the SoC). In response, the monitor processor 540 may halt the select controller 820 by de-asserting the monitor enable signal, retrieve the set of monitor indicators in the memory 840 corresponding to the indicated mode of operation, and program (load) the retrieved set of monitor indicators in the register 830. After programming (loading) is complete, the monitor processor 540 may assert the monitor enable signal. In response, the select controller 820 may start cycling through the clock signals in the subset specified by the set of monitor indicators programmed (loaded) into the register 830.

Figure 8D:
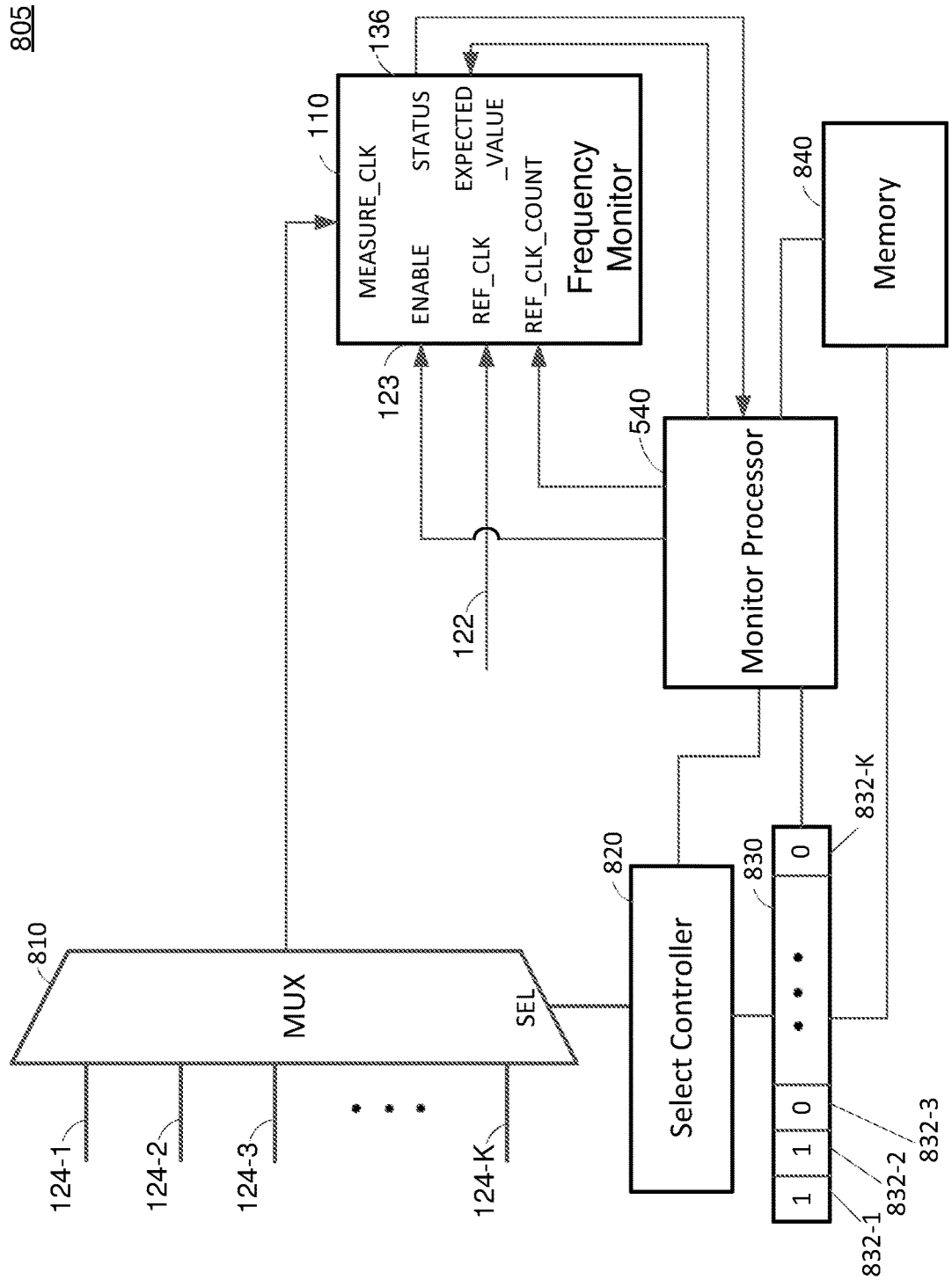
FIG. 8D shows an example in which a reference count value or expected count value of the frequency monitor is adjusted for different clock signals according to certain aspects of the present disclosure.

In certain aspects, the clock signals being monitored by the monitor processor 540 may have different frequencies. In one example, the monitor processor 540 may adjust the expected count value according to the expected frequency of the clock signal being monitored at a given time. In this regard, FIG. 8D shows an example in which the monitor processor 540 is coupled to expected count value input (labeled "EXP_VALUE") of the frequency monitor 110. In this example, the monitor processor 540 may adjust the expected count value of the frequency monitor 110 according to the expected frequency of the clock signal being monitored at a given time while the time duration (time window) of the frequency monitor is held constant. For example, if a first one of the clock signals has an expected frequency that is twice the expected frequency of a second one of the clock signals, then the monitor processor 540 may use an expected count value for the first one of the clock signals that is twice the expected count value used for the second one of the clock signals. This is because a clock signal running at twice the frequency is expected to generate twice the count value for a given time duration (time window).

In another example, the monitor processor 540 may adjust the reference count value R for the frequency monitor 110 according to the expected frequency of the clock signal being monitored at a given time. As discussed above, the reference count value R defines the time duration (time window) over which the up counter 130 counts the number of periods (cycles) of the clock signal being monitored. In this regard, FIG. 8D shows an example in which the monitor processor 540 is coupled to the reference count value input (labeled "REF_CLK_COUNT") of the frequency monitor 110. In this example, the monitor processor 540 may adjust the reference count value R to the frequency monitor 110 according to the expected frequency of the clock signal being monitored at a given time while the expected count value of the frequency monitor is held constant. For example, if a first one of the clock signals has an expected frequency that is twice the expected frequency of a second one of the clock signals, then the monitor processor 540 may use a reference count value R for the first one of the clock signals that is half the reference count value R used for the second one of the clock signals. This is because a clock signal running at twice the frequency generates a given count value in half the amount of time.

Figure 8E:
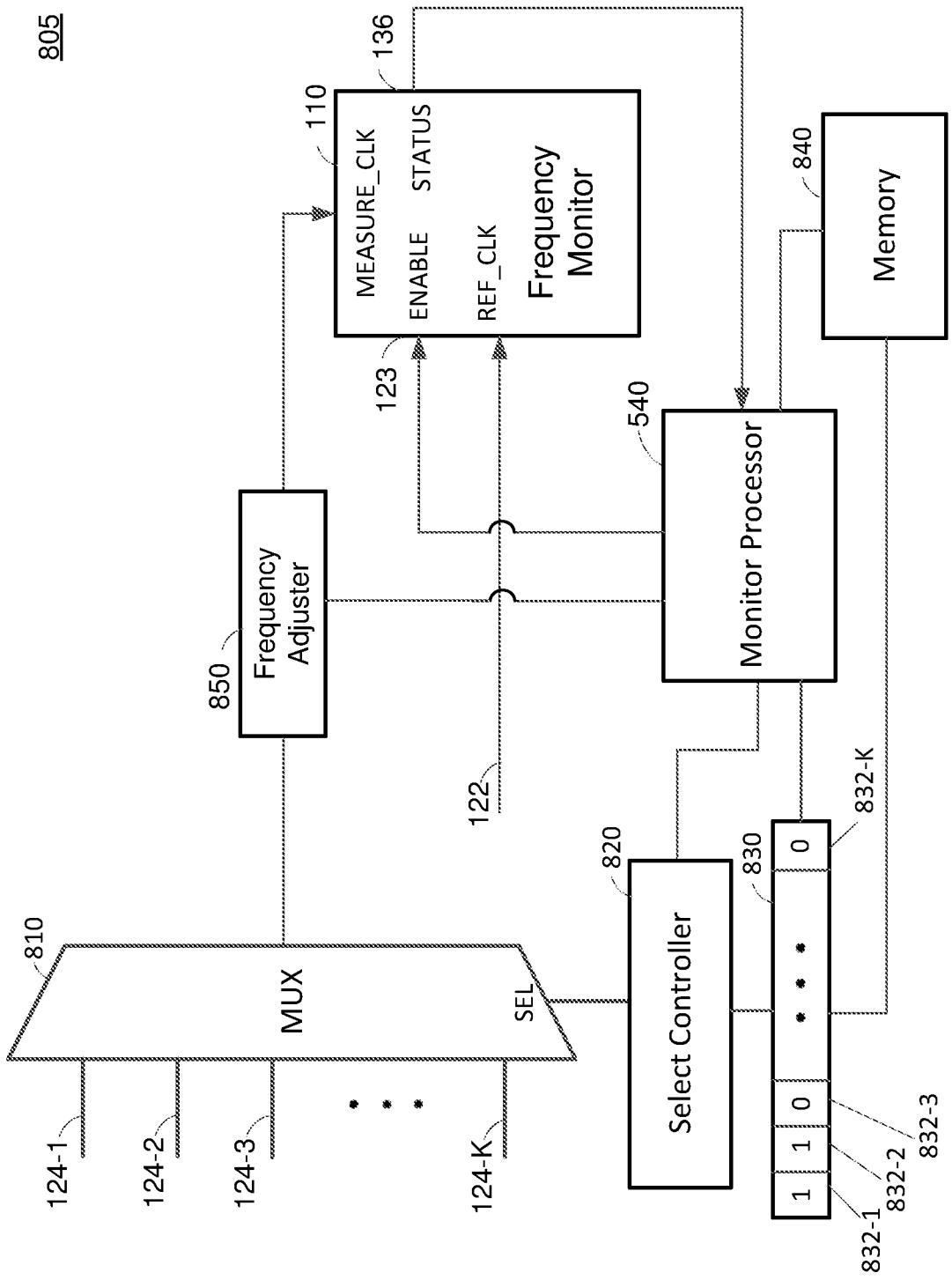
FIG. 8E shows an example of a frequency adjuster coupled between an output of the multiplexer and the frequency monitor according to certain aspects of the present disclosure.

FIG. 8E shows another example in which the SoC includes a frequency adjuster 850 between the output of the multiplexer 810 and the clock measurement input (labeled "MEASURE_CLK") of the frequency monitor 110. The frequency adjuster 850 is configured to adjust the frequency of the clock signal output from the multiplexer 810 under the control of the monitor processor 540. The frequency adjuster 850 may be implemented with a frequency divider that adjusts the frequency of the clock signal by dividing the frequency of the clock signal by an adjustable divisor. Alternatively, the frequency adjuster 850 may be implemented with a pulse swallower that adjusts the frequency of the clock signal may swallowing an adjustable number of pulses of the clock signal.

In this example, the monitor processor 540 controls the frequency adjuster 850 according the clock signal output by the multiplexer 810 at a given time so that the expected frequency input to the frequency monitor 110 is approximately constant. For example, if a first one of the clock signals has a higher expected frequency than a second one of the clock signals, then the monitor processor 540 may have the frequency adjuster 850 reduce the expected frequency of the first one of the clock signals to the expected frequency of the second one of the clock signals. In this example, the frequency adjuster 850 leaves the expected frequency of the second one of the clock signals unchanged. Thus, in this example, the frequency adjuster 850 outputs the same expected frequency to the frequency monitor 110 for the first and second ones of the clock signals. In this example, the expected count value and reference count value may be the same for the first and second ones of clock signals since the frequency adjuster 850 outputs the same expected frequency for both.

Figure 8F:
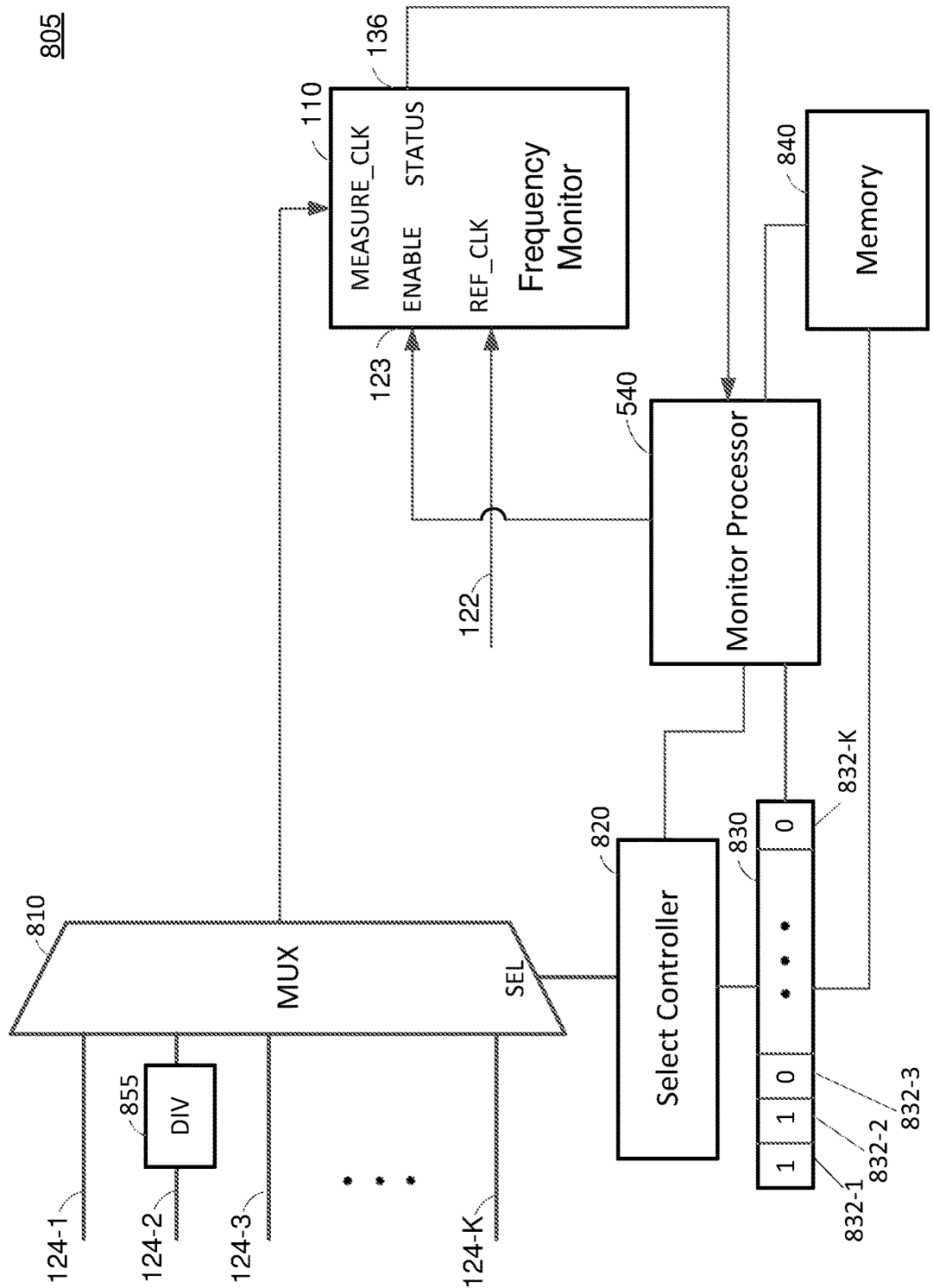
FIG. 8F shows an example of a frequency divider coupled to one of the inputs of the multiplexer according to certain aspects of the present disclosure.

In the above example, the frequency at the output of the multiplexer 810 is adjusted so that the same expected frequency is input to the frequency monitor 110 for different clock signals. However, it is to be appreciated that the present disclosure is not limited to this example. For example, frequency adjustments may be performed at one or more inputs of the multiplexer 810 so that the same expected frequency is output for different clock signals. In this regard, FIG. 8F shows an example in which a frequency divider 855 is coupled to the input of the multiplexer 810 corresponding to clock signal 124-2. In this example, clock signals 124-1, 124-3 and 124-K may have the same expected frequency and clock signal 124-2 may have an expected frequency that is twice that of clock signals 124-1, 124-3 and 124-K. In this example, the clock divider 855 divides the frequency of clock signal 124-2 by two so that the multiplexer outputs the same expected frequency for clock signals 124-1, 124-2, 124-3 and 124-K. Although one clock divider 855 is shown in the example in FIG. 8F, it is to be appreciated that the SoC may include two or more clock dividers at different inputs of the multiplexer 810 so that the expected frequency output by the multiplexer 810 is the same for different clock signals.

Figure 9:
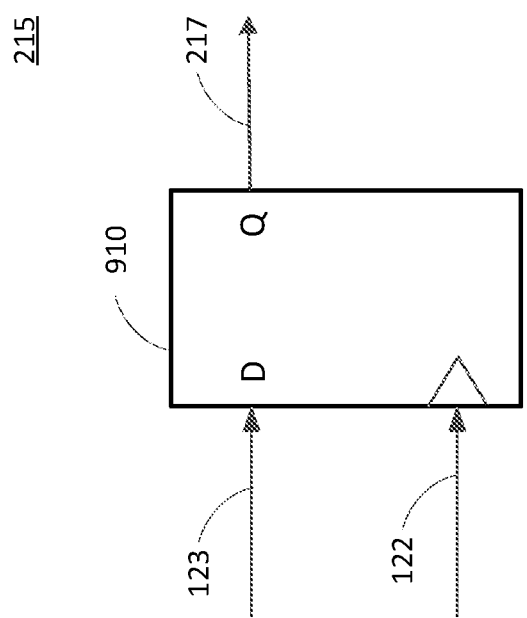
FIG. 9 shows an exemplary implementation of a synchronizer for synchronizing an enable signal with a reference clock signal according to certain aspects of the present disclosure.

As discussed above, the synchronizer 215 synchronizes the input enable signal 123 with the reference clock signal 122 to generate the synchronized input enable signal 217. The synchronizer 215 may be implemented with a latch that is clocked by the reference clock signal 122. In this regard, FIG. 9 shows an example is which the synchronizer 215 is implemented with a latch 910. The latch 910 has a signal input (labeled "D") that receives the input enable signal 123, a clock input that receives the reference clock signal 122, and an output (labeled "Q") that outputs the synchronized input enable signal 217. In operation, the latch 910 latches (samples) the logic value of the input enable signal 123 on a rising or falling edge of the reference clock signal 122, and outputs the latched (sampled) logic value at the output of the latch 910. This aligns an edge (transition) of the input enable signal 217 with a rising or falling edge of the reference clock signal 122.

Figure 10:
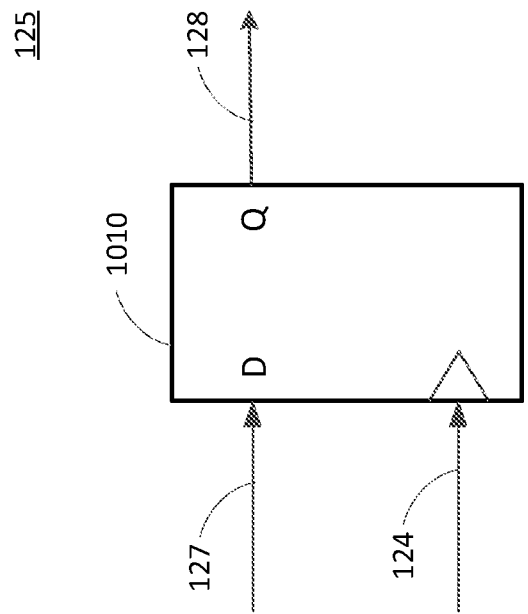
FIG. 10 shows an exemplary implementation of a synchronizer for synchronizing an enable signal with a monitored clock signal according to certain aspects of the present disclosure.

As discussed above, the synchronizer 125 synchronizes the count enable signal 127 with the monitored clock signal 124 to generate the synchronized input count enable signal 128. The synchronizer 125 may be implemented with a latch that is clocked by the monitored clock signal 124. In this regard, FIG. 10 shows an example is which the synchronizer 125 is implemented with a latch 1010. The latch 1010 has a signal input (labeled "D") that receives the count enable signal 127, a clock input that receives the monitored clock signal 124, and an output (labeled "Q") that outputs the synchronized input count enable signal 128. In operation, the latch 1010 latches (samples) the logic value of the count enable signal 127 on a rising or falling edge of the monitored clock signal 124, and outputs the latched (sampled) logic value at the output of the latch 1010. This aligns an edge (transition) of the count enable signal 128 with a rising or falling edge of the monitored clock signal 124.

Figure 11:
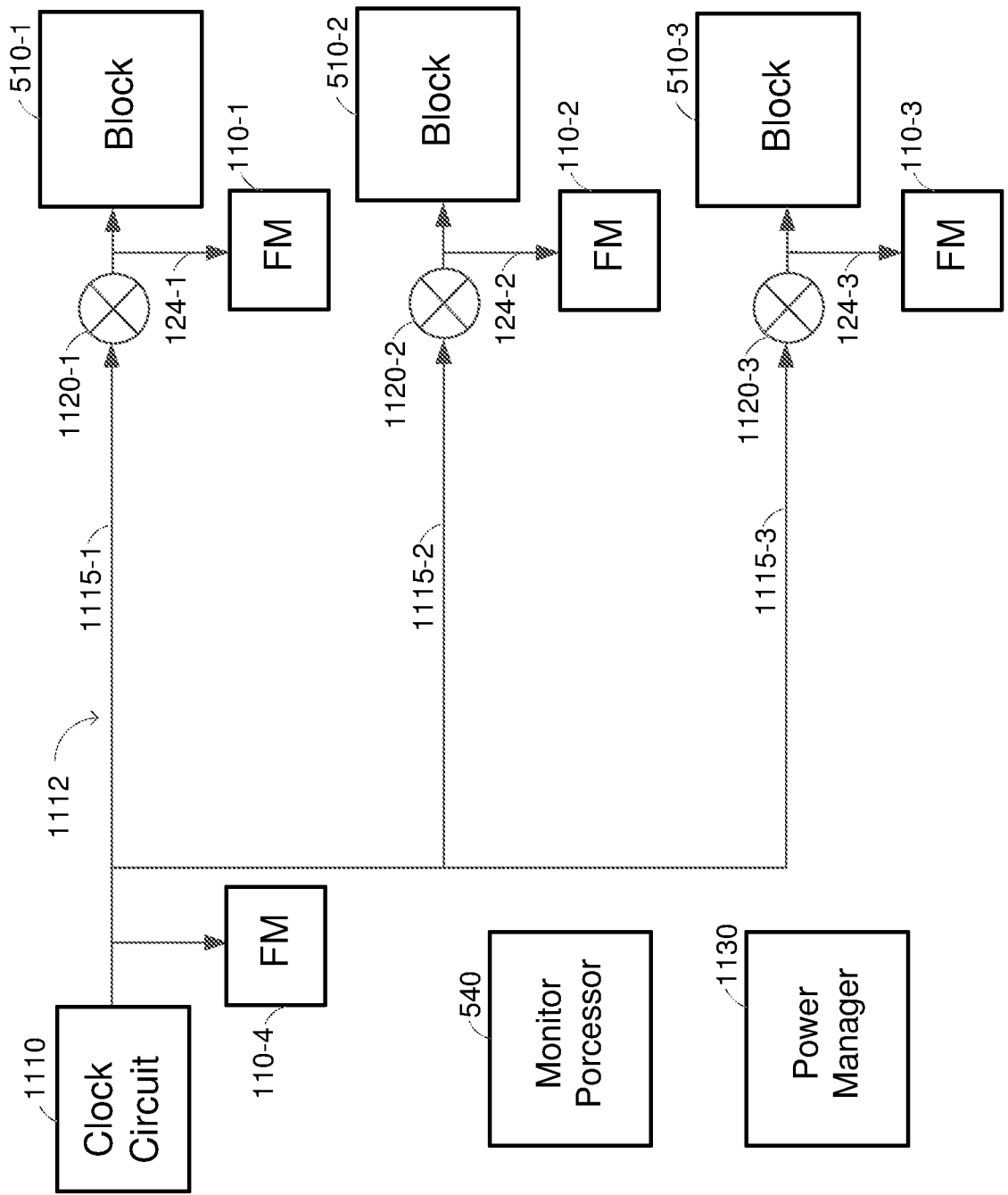
FIG. 11 shows an example of multiple frequency monitors configured to measure clock frequencies at multiple locations of a clock tree according to certain aspects of the present disclosure.

Frequency monitors according to aspects of the present disclosure may be used to monitor and/or test clock signals in a clock tree. In this regard, FIG. 11 shows an example in which the SoC includes a clock tree 1112 for distributing a clock signal from a clock circuit 1110 to multiple blocks 510-1 to 510-3 on the SoC. The clock circuit 1110 may include a phase locked loop or another clock circuit. In some aspects, the frequency of clock signal output by the clock circuit 1110 may be adjustable for clock frequency scaling. As shown in FIG. 11, the clock tree 1112 branches off into multiple branches 1115-1 to 1115-3, in which each branch provides the clock signal to a respective one of the blocks 510-1 to 510-3. Although not explicitly shown in FIG. 11, it is to be appreciated that each of the branches 1115-1 to 1115-3 may include one or more buffers (e.g., inverters, drivers, etc.). Also, it is to be appreciated that a branch may include a clock divider to adjust the frequency of the clock signal provided to the respective block.

The SoC may also include multiple clock gating devices 1120-1 to 1120-3, in which each clock gating device is coupled between one of the branches of the clock tree and the respective block. Each clock gating device is configured to pass or gate the respective clock signal under the control of a power manager 1130. The clock gating devices 1120-1 to 1120-3 allow the power manager 1130 to independently gate the clock signals to the blocks to conserve power. For example, if a block is not in use at a given time, the power manager 1130 may instruct the respective clock gating device to gate the clock signal to the block. Gating the clock signal reduces dynamic power consumption by stopping switching activity in the block due to the clock signal. When a block is in use, the power manager 1130 instructs the respective clock gating device to pass the clock signal to the block. For ease of illustration, the individual connections between the power manager 1130 and the clock gating devices 1120-1 to 1120-3 are not shown in FIG. 11.

The SoC also include multiple frequency monitors 110-1 to 110-4 distributed on the SoC to monitor and/or test clock signals at different locations on the clock tree 1112. In the example in FIG. 11, frequency monitor 110-4 is coupled to the root of the clock tree 1112 near the clock circuit 1110. Each of frequency monitors 110-1 to 110-3 is coupled between one of the clock gating devices 1120-1 to 1120-3 and the respective block. Each frequency monitor 110-1 to 110-4 may be implemented using the frequency monitor 110 in FIG. 1.

In certain aspects, the frequency monitors 110-1 to 110-4 are coupled to the monitor processor 540 to allow the monitor processor 540 to monitor clock signals at different locations on the clock tree 1112. In one example, the monitor processor 540 may be coupled to the frequency monitors 110-1 to 110-4 using the daisy chain topology shown in FIG. 6. In this example, the frequency monitors 110-1 to 110-4 are coupled in a daisy chain, as discussed above. In another example, the monitor processor 540 may be separately coupled to each frequency monitor 110-1 to 110-4 using the topology illustrated in FIG. 7. For ease of illustration, the individual connections between the frequency monitors 110-1 to 110-4 and the monitor processor 540 are not shown in FIG. 11.

In operation, the monitor processor 540 may periodically check the clock status at the root of the clock tree 1112 using frequency monitor 110-4 to ensure that the clock signal output by the clock circuit 1110 meets the specification. For each of the block 510-1 to 510-3, the monitor processor 540 may periodically check the clock status for the block using the respective one of frequency monitors 110-1 to 110-3 to ensure that the clock signal provided to the block meets the specification. As discussed above, the monitor processor 540 determines that a clock signal meets the specification if the monitor processor 540 receives a pass status signal from the respective frequency monitor, and determines that the clock signal fails to meet the specification if the monitor processor receives a fail status signal from the respective frequency monitor.

The frequency monitors 110-1 to 110-4 may also be used to measure the frequencies of the respective clock signals during testing. In this example, the monitor processor 540 is coupled to the count value outputs (labeled "Count_Value" in FIG. 1) of the frequency monitors 110-1 to 110-4. During testing, the monitor processor receives count values from the frequency monitors 110-1 to 110-4, in which the count value from each frequency monitor provides a digital frequency measurement of the respective clock signal. The monitor processor may evaluate the digital frequency measurements, for example, to verify that the frequencies of the clock signals lie within an acceptable range.

In certain aspects, the monitor processor may receive frequency measurements for the clock signals 124-1 to 124-4 for different conditions. For example, the supply voltage of the clock tree, clock circuit and/or blocks may be sequentially set to different supply voltage levels. In this example, the monitor processor may receive frequency measurements (i.e., count values) for the clock signals 124-1 to 124-4 at each one of the supply voltage levels. This information may be used, for example, to determine a minimum one of the supply voltage levels at which the frequencies of the clock signals lie within an acceptable range defined by a specification.

Figure 12A:
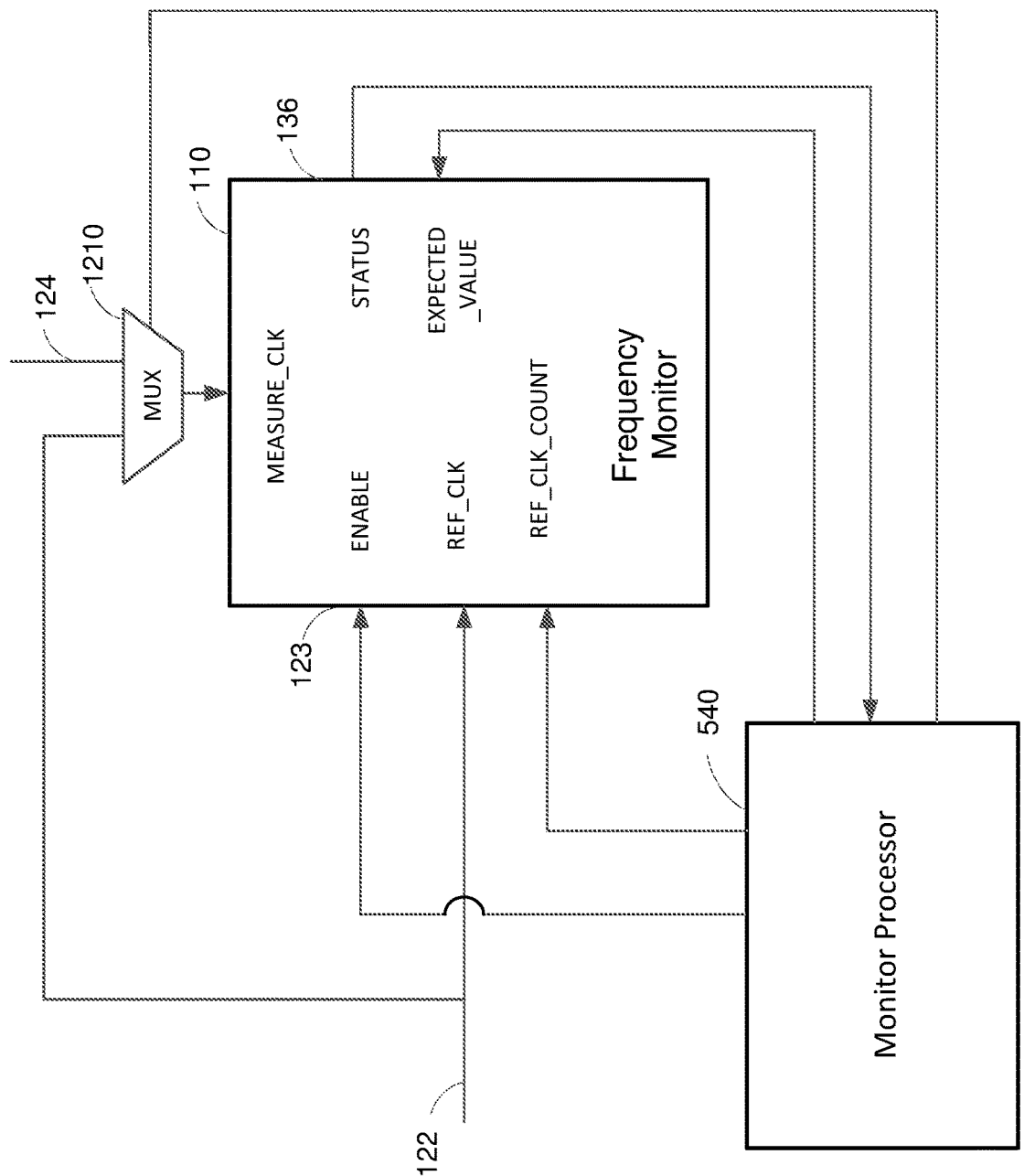
FIG. 12A shows an example of a frequency monitor capable of operating in a self-test mode according to certain aspects of the present disclosure.

In certain aspects, a frequency monitor is capable of performing a self-test to check whether the frequency monitor is functioning properly. In this regard, FIG. 12A shows an example in which the SoC includes a multiplexer 1210 having a first input coupled to the reference clock signal 122, a second input coupled to the monitored clock signal 124, and an output coupled to the clock measurement input (labeled "MEASURE_CLK") of the frequency monitor 110. In this example, the multiplexer 1210 selectively couples the reference clock signal 122 or the monitored clock signal 124 to the clock measurement input of the frequency monitor 110 under the control of the monitor processor 540. More particularly, in a normal mode (non-self-test mode), the monitor processor 540 instructs the multiplexer 1210 to couple the monitored clock signal 124 to the clock measurement input of the frequency monitor 110. In this mode, the frequency monitor 110 monitors the frequency of the monitored clock signal 124, as discussed above.

In a self-test mode, the monitor processor 540 instructs the multiplexer 1210 to couple the reference clock signal 122 to the clock measurement input of the frequency monitor 110. Thus, when the frequency monitor 110 is enabled in this mode, the up counter 130 (not shown in FIG. 12A) counts periods (cycles) of the reference clock signal 122 over the time duration (time window). In this mode, the monitor processor 540 sets the expected count value of the frequency monitor 110 to a count value of approximately $f_r*T$, where $f_r$ is the frequency of the reference clock signal 122 and T is the time duration (time window) over which the up counter 130 counts periods of the reference clock signal 122. The reference clock signal 122 can be used for the self-test because the reference clock signal 122 has a well-defined frequency.

In this example, the monitor processor 540 initiates a self-test of the frequency monitor 540 by instructing the multiplexer 1210 to couple the reference clock signal 122 to the frequency monitor 110. The monitor processor 540 then asserts the input enable signal of the frequency monitor 110. In response, the monitor processor 540 receives a status signal 136 from the frequency monitor 110 indicating a pass or a fail. A pass status signal indicates that the frequency monitor 110 is functioning properly. A fail status signal, on the other hand, indicates that the frequency monitor 110 is not functioning properly. In this case, the monitor processor 540 may output an error signal indicating the frequency monitor 110 is not working. In one example, the error signal may be output to a system manager that manages the block corresponding to the monitored clock signal 124. In this example, the system manager may disable (clock gate) the block in response to the error signal since the error signal indicates that the frequency monitor 110 cannot be relied on to monitor the clock signal of the block.

Figure 12B:
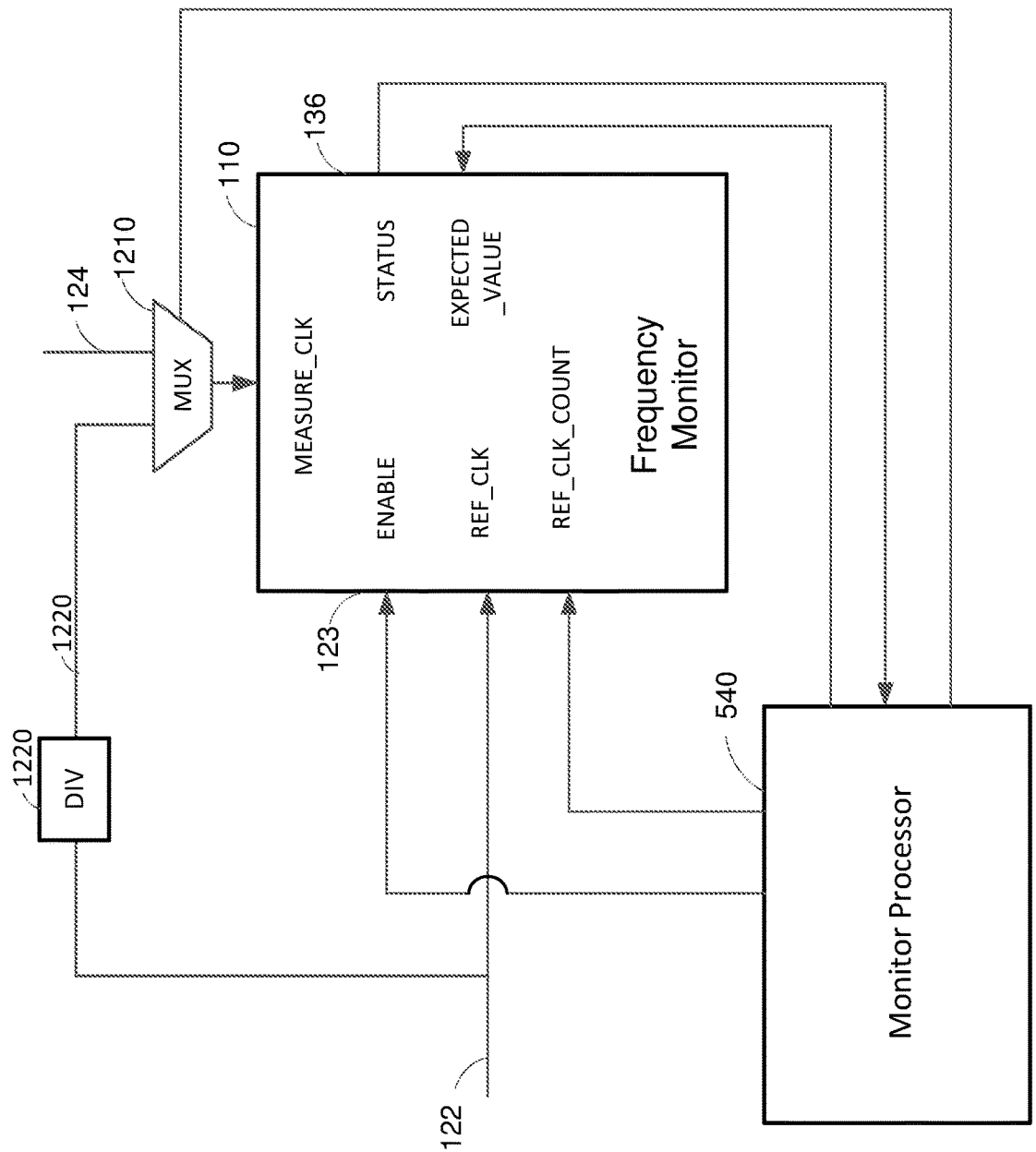
FIG. 12B shows another example of a frequency monitor capable of operating in a self-test mode according to certain aspects of the present disclosure.

FIG. 12B shows an example in which the SoC further includes a frequency divider 1220 coupled to the first input of the multiplexer 1210. In this example, the frequency divider 1220 is configured to divide the frequency of the reference clock signal 122 by a divider value of D to generate a frequency-divided reference clock signal 1222, which is input to the multiplexer 1210. Thus, in the self-test mode, the multiplexer 1210 outputs the frequency-divided reference clock signal 1222 to the clock measurement input (labeled "MEASURE_CLK") of the frequency monitor 110. The frequency-divided reference clock signal has a frequency of $f_r/D$.

In the self-test mode, the monitor processor 540 instructs the multiplexer 1210 to couple the frequency-divided reference clock signal 1222 to the clock measurement input of the frequency monitor 110. Thus, when the frequency monitor 110 is enabled in this mode, the up counter 130 (not shown in FIG. 12A) counts periods (cycles) of the frequency-divided reference clock signal 1222 over the time duration (time window). In this mode, the monitor processor 540 sets the expected count value of the frequency monitor 110 to a count value of approximately $(f_r/D)*T$, where $(f_r/D)$ is the frequency of the frequency-divided reference clock signal 1222 and T is the time duration (time window) over which the up counter 130 counts periods of the frequency-divided reference clock signal 1222.

In this example, the monitor processor 540 initiates a self-test of the frequency monitor 540 by instructing the multiplexer 1210 to couple the frequency-divided reference clock signal 1222 to the frequency monitor 110. The monitor processor 540 then asserts the input enable signal of the frequency monitor 110. In response, the monitor processor 540 receives a status signal 136 from the frequency monitor 110 indicating a pass or a fail. A pass status signal indicates that the frequency monitor 110 is functioning properly. A fail status signal, on the other hand, indicates that the frequency monitor 110 is not functioning properly, in which case the monitor processor 540 may output an error signal, as discussed above.

In the above discussion, the reference clock signal 122 or the frequency-divided reference clock signal 1222 may be referred to as a test clock signal since the reference clock signal 122 or the frequency-divided reference clock signal 1222 is used for self testing of the frequency monitor 110 in the above examples. Similarly, the count value in the self-test mode may be referred to as a test count value, the expected count values in the self-test mode may be referred to as an expected test count value, and the time duration in the self-test mode may be referred to as a test time duration. The time duration in the self-test mode may be the same or different from the time duration in the normal mode (non-self-test mode). The status signal in the self-test mode may be referred to as a self-test status signal since the status signal in this mode indicates whether the frequency monitor 110 is functioning properly. Although the multiplexer 1210 is shown being separate from the frequency monitor 110 for ease of discussion, it is to be appreciated that the multiplexer 1210 may be considered part of the frequency monitor 110. Also, it is to be appreciated that one or more LBSs of the test count value and expected test count value may be masked out using the mask control signal, in which case test count value does not have be exactly equal to the expected test count value to output a pass status signal.

Although the reference clock signal 122 is used for the self-test in the above examples, it is to be appreciated that the present disclosure is not limited to the reference clock signal 122. For example, a second reference clock signal with a well-defined frequency may be coupled to the first input of the multiplexer 1210. In this example, the multiplexer 1210 couples the second reference clock signal to the frequency monitor 110 in the self-test mode, and the expected count value of the frequency monitor is set to $f_{r2}*T$, where $f_{r2}$ is the frequency of the second reference clock signal and T is the time duration (time window) over which the up counter 130 counts periods of the second reference clock signal. The down counter still runs off of the first reference clock signal 122 discussed above. The second reference clock signal may come from a crystal oscillator or another clock source having a well-defined frequency.

Figure 13:
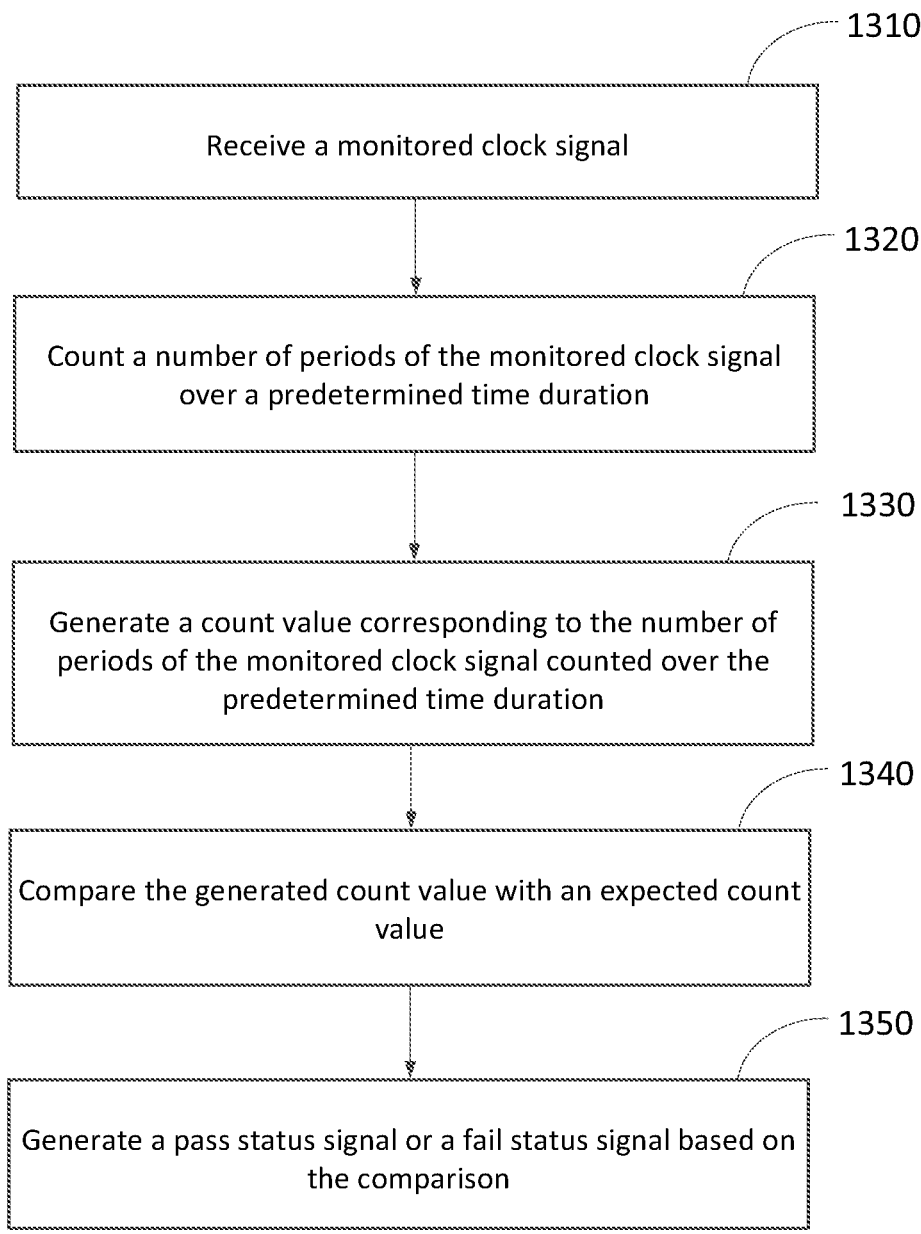
FIG. 13 is a flowchart illustrating a method for frequency monitoring according to certain aspects of the present disclosure.

FIG. 13 illustrates a method 1300 for frequency monitoring according to certain aspects of the present disclosure. The method 1300 may be performed by the on-chip frequency monitor 110.

At step 1310, a monitored clock signal is received. For example, the monitored clock signal (e.g., monitored clock signal 124) may be a clock signal input to a block (e.g., block 510).

At step 1320, a number of periods of the monitored clock signal is counted over a predetermined time duration. For example, the number of periods of the monitored clock signal may be counted using a counter (e.g., up counter 130). The predetermined time duration may correspond to a predetermined number of periods of a reference clock signal (e.g., reference clock signal 122).

At step 1330, a count value is generated corresponding to the number of periods of the monitored clock signal counted over the predetermined time duration.

At step 1340, the generated count value is compared with an expected count value. For example, the expected count value may represent the count value that should be generated if the frequency of the monitored clock signal is approximately equal to an expected frequency (i.e., a frequency meeting a specification).

At step 1350, a pass status signal or a fail status signal is generated based on the comparison. For example, the pass status signal may be generated if the generated count value lies within a count range about the expected count value, and the fail status signal may be generated if the generated count value lies outside the count range.

It is to be appreciated that the present disclosure is not limited to the exemplary logic values used above to describe aspects of the present disclosure. For example, although the enable signals were described using the example in which an enable signal has a logic value of one when asserted and a logic value of zero when de-asserted, it is to be appreciated that the logic values may be reversed (i.e., an enable signal may have a logic value of zero when asserted and a logic value of one when de-asserted). Similarly, although a status signal was described above as having a logic value of one for a pass and a logic value of zero for a fail, it is to be appreciated that the logic values may be reversed. In this case, the monitor processor 540 may interpret a status signal having a logic value of zero as a pass and a status signal having a logic value of one as a fail.

Within the present disclosure, the term "approximately" means within 10 percent of the stated value. Also, the term "frequency range" is intended to cover a range of frequencies or a single frequency.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components. The term "circuit" is used broadly, and intended to cover hardware implementations of electrical devices and conductors that, when connected and configured, enable the performance of the functions described in the present disclosure. The term "circuit" is also intended to cover software implementations, in which a processor performs the functions described herein by executing software comprising code for performing the functions. The software may be stored on a computer-readable storage medium, such as a RAM, a ROM, an EEPROM, an optical disk, and/or a magnetic disk.

It is to be understood that present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A frequency monitor, comprising:
   a counter configured to receive a monitored clock signal, to count a number of periods of the monitored clock signal over a predetermined time duration, and to output a count value corresponding to the number of periods of the monitored clock signal; and
   a comparator configured to receive the count value from the counter, to receive an expected count value, to mask out N least significant bits (LSBs) of the count value from the counter, to mask out N LSBs of the expected count value, to compare unmasked bits of the count value with unmasked bits of the expected count value, and to output a pass status signal or a fail status signal based on the comparison.

2. The frequency monitor of claim 1, wherein the comparator is configured to output the pass status signal if the unmasked bits of the count value from the counter match the unmasked bits of the expected count value.

3. The frequency monitor of claim 2, wherein the comparator is configured to output the fail status signal if the unmasked bits of the count value from the counter do not match the unmasked bits of the expected count value.

4. The frequency monitor of claim 1, wherein N is specified by a mask control signal input to the comparator.

5. The frequency monitor of claim 1, wherein:
   in a self-test mode, the counter is configured to receive a test clock signal, to count a number of periods of the test clock signal over a test time duration, and to output a test count value corresponding to the number of periods of the test clock signal; and
   in the self-test mode, the comparator is configured to receive the test count value from the counter, to compare the test count value with an expected test count value, and to output a self-test status signal indicating whether the frequency monitor is functioning properly based on the comparison of the test count value with the expected test count value.

6. The frequency monitor of claim 5, wherein the frequency monitor further comprises a multiplexer having a first input coupled to the test clock signal, a second input coupled to the monitored clock signal, and an output coupled to the counter, wherein the multiplexer is configured to couple the test clock signal to the counter in the self-test mode, and to couple the monitored clock signal to the counter in a non-self-test mode.

7. The frequency monitor of claim 5, wherein the self-test status signal indicates the frequency monitor is functioning properly if the test count value is within a predetermined range of the expected test count value, and the self-test status signal indicates the frequency monitor is not functioning properly if the test count value is outside the range of the expected test count value.

8. The frequency monitor of claim 1, wherein the monitored clock signal is a clock signal input to a processor located on a same chip as the frequency monitor.

9. A frequency monitor, comprising:
   a count control device configured to output a count enable signal;
   a synchronizer configured to synchronize the count enable signal with a monitored clock signal to generate a synchronized count enable signal;
   a counter configured to receive the synchronized count enable signal and the monitored clock signal, to count a number of periods of the monitored clock signal in response to the synchronized count enable signal, and to output a count value corresponding to the number of periods of the monitored clock signal; and a comparator configured to receive the count value from the counter, to receive an expected count value, to compare the count value from the counter with the expected count value, and to output a pass status signal or a fail status signal based on the comparison.

10. The frequency monitor of claim 9, wherein the synchronizer is configured to synchronize the count enable signal with the monitored clock signal by aligning an edge of the count enable signal with an edge of the monitored clock signal.

11. The frequency monitor of claim 9, wherein the count control device is configured to receive a reference clock signal, and to output the count enable signal for a predetermined number of periods of the reference clock signal.

12. The frequency monitor of claim 9, wherein the synchronizer comprises a latch having a signal input configured to receive the count enable signal, a clock input configured to receive the monitored clock signal, and an output configured to output the synchronized count enable signal, wherein the latch is configured to latch a logic value of the count enable signal on an edge of the monitored clock signal, and to output the latched logic value at the output of the latch.

13. A method for frequency monitoring, comprising:
receiving a monitored clock signal;
counting a number of periods of the monitored clock signal over a predetermined time duration;
generating a count value corresponding to the number of periods of the monitored clock signal counted over the predetermined time duration;
masking out N least significant bits (LSBs) of the generated count value;
masking out N LSBs of the expected count value;
comparing unmasked bits of the generated count value with unmasked bits of the expected count value; and
generating a pass status signal or a fail status signal based on the comparison.

14. The method of claim 13, wherein generating the pass status signal or the fail status signal comprises:
generating the pass status signal if the unmasked bits of the generated count value match the unmasked bits of the expected count value; and
generating the fails status signal if the unmasked bits of the generated count value do not match the unmasked bits of the expected count value.

15. The method of claim 13, further comprises:
synchronizing a count enable signal with the monitored clock signal to generate a synchronized count enable signal;
wherein counting the number of periods of the monitored clock signal over the predetermined time duration comprises starting the counting on an edge of the synchronized count enable signal.

16. The method of claim 15, wherein synchronizing the count enable signal with the monitored clock signal comprises aligning an edge of the count enable signal with an edge of the monitored clock signal.

17. A frequency monitoring system, comprising:
a multiplexer having multiple inputs and an output, wherein each of the multiple inputs is coupled to a respective one of multiple clock signals;
a select controller configured to instruct the multiplexer to sequentially couple each clock signal in a subset of the multiple clock signals to the output of the multiplexer;
a frequency monitor coupled to the output of the multiplexer, wherein the frequency monitor is configured to sequentially receive each clock signal in the subset of the multiple clock signals, and wherein, for each clock signal in the subset of the multiple clock signals, the frequency monitor is configured to determine whether the clock signal is within a respective frequency range, and to output a status signal based on the determination; and
a register that stores a set of monitor indicators, wherein each of the monitor indicators corresponds to a respective one of the multiple clock signals, and a value of each of the monitor indicators indicates whether the respective one of the multiple clock signals is in the subset of the multiple clock signals.

18. The frequency monitoring system of claim 17, wherein the value of each of the monitor indicators is a bit value.

19. The frequency monitoring system of claim 17, wherein, for each clock signal in the subset of the multiple clock signal, the respective status signal indicates a pass if a determination is made that the clock signal is within the respective frequency range, and indicates a fail if a determination is made that the clock signal is outside the respective frequency range.

20. The frequency monitoring system of claim 17, further comprising:
a memory storing multiple sets of monitor indicators, wherein each of the multiple sets of monitor indicators corresponds to a respective one of multiple modes of operation; and
a monitor processor configured to receive a signal indicating one of the multiple modes of operation, to retrieve one of the multiple sets of monitor indicators corresponding to the indicated mode of operation, and to program the one of the multiple sets of monitor indicators in the register.

21. The frequency monitoring system of claim 17, further comprising a frequency divider coupled between the output of the multiplexer and the frequency monitor.

\* \* \* \* \*